(12) United States Patent
Roh et al.

(10) Patent No.: US 12,279,462 B2
(45) Date of Patent: *Apr. 15, 2025

(54) COLOR SEPARATION ELEMENT AND IMAGE SENSOR INCLUDING THE SAME

(71) Applicant: SAMSUNG ELECTRONICS CO., LTD., Suwon-si (KR)

(72) Inventors: Sookyoung Roh, Yongin-si (KR); Seokho Yun, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/312,851

(22) Filed: May 5, 2023

(65) Prior Publication Data

US 2023/0290797 A1  Sep. 14, 2023

Related U.S. Application Data

(63) Continuation of application No. 17/077,081, filed on Oct. 22, 2020, now Pat. No. 11,682,685.

(30) Foreign Application Priority Data

Oct. 24, 2019  (KR) .................. 10-2019-0133275
Sep. 23, 2020  (KR) .................. 10-2020-0122851

(51) Int. Cl.
*H01L 27/146* (2006.01)
*H01L 27/148* (2006.01)
(Continued)

(52) U.S. Cl.
CPC ....... *H10F 39/8053* (2025.01); *H04N 25/134* (2023.01); *H10F 39/156* (2025.01); *H10F 39/182* (2025.01); *H10F 39/806* (2025.01)

(58) Field of Classification Search
CPC ......... H01L 27/14621; H01L 27/14625; H01L 27/14645; H01L 27/14868; H04N 9/04557
See application file for complete search history.

(56) References Cited

U.S. PATENT DOCUMENTS 8,289,422 B2  10/2012  Hiramoto et al.
8,687,174 B2  4/2014  Fossum et al.
(Continued)

FOREIGN PATENT DOCUMENTS

CN      106483594 A     3/2017
KR   10-2017-0037452 A  4/2017
(Continued)

OTHER PUBLICATIONS

Chen et al., "GaN Metalens for Pixel-Level Full-Color Routing at Visible Light," ACS Publications, American Chemical Society, Nano Letters vol. 17, 2017, pp. 6345-6352.
(Continued)

*Primary Examiner* — Lin Ye
*Assistant Examiner* — Tuan H Le
(74) *Attorney, Agent, or Firm* — Sughrue Mion, PLLC

(57) ABSTRACT

Provided are a color separation element and an image sensor including the same. The color separation element includes a spacer layer; and a color separation lens array, which includes at least one nano-post arranged in the spacer layer and is configured to form a phase distribution for splitting and focusing incident light according to wavelengths, wherein periodic regions in which color separation lens arrays are repeatedly arranged are provided, and the color separation lens array is configured to interrupt phase distribution at the boundary of the periodic regions.

18 Claims, 46 Drawing Sheets

(51) Int. Cl.
  *H04N 25/13* (2023.01)
  *H10F 39/00* (2025.01)
  *H10F 39/15* (2025.01)
  *H10F 39/18* (2025.01)

(56) References Cited

U.S. PATENT DOCUMENTS

| | | |
|---|---|---|
| 9,188,841 B2 | 11/2015 | Fukunaga |
| 10,490,584 B2 | 11/2019 | Yun et al. |
| 11,682,685 B2 * | 6/2023 | Roh ................. H01L 27/14625 348/207.99 |
| 11,948,955 B2 | 4/2024 | Roh et al. |
| 2006/0209413 A1 | 9/2006 | Kim et al. |
| 2009/0250594 A1 | 10/2009 | Tanaka et al. |
| 2010/0127156 A1 | 5/2010 | Yokogawa |
| 2012/0206637 A1 | 8/2012 | Hiramoto et al. |
| 2012/0212656 A1 | 8/2012 | Hiramoto et al. |
| 2016/0146984 A1 | 5/2016 | Jiang et al. |
| 2017/0092668 A1 | 3/2017 | Kim et al. |
| 2018/0098038 A1 | 4/2018 | Yun et al. |
| 2019/0058871 A1 | 2/2019 | Han et al. |
| 2020/0344430 A1 | 10/2020 | Wang et al. |
| 2021/0124179 A1 | 4/2021 | Yun et al. |
| 2021/0288095 A1 | 9/2021 | Delga et al. |

FOREIGN PATENT DOCUMENTS

| | | |
|---|---|---|
| KR | 10-1818587 B1 | 1/2018 |
| KR | 10-2019-0018351 A | 2/2019 |

OTHER PUBLICATIONS

Nishiwaki et al., "Efficient colour splitters for high-pixel-density image sensors," Nature Photonics, vol. 7, Mar. 2013, pp. 240-246.

* cited by examiner

FIG. 3B

| C | M | C | M | C | M | C | M |
|---|---|---|---|---|---|---|---|
| Y | G | Y | G | Y | G | Y | G |
| C | M | C | M | C | M | C | M |
| Y | G | Y | G | Y | G | Y | G |
| C | M | C | M | C | M | C | M |
| Y | G | Y | G | Y | G | Y | G |
| C | M | C | M | C | M | C | M |
| Y | G | Y | G | Y | G | Y | G |

FIG. 3C

| R | G | R | G | R | G | R | G |
|---|---|---|---|---|---|---|---|
| B | W | B | W | B | W | B | W |
| R | G | R | G | R | G | R | G |
| B | W | B | W | B | W | B | W |
| R | G | R | G | R | G | R | G |
| B | W | B | W | B | W | B | W |
| R | G | R | G | R | G | R | G |
| B | W | B | W | B | W | B | W |

COLOR SEPARATION ELEMENT AND IMAGE SENSOR INCLUDING THE SAME

CROSS-REFERENCE TO RELATED APPLICATION(S)

This application is a Continuation of U.S. application Ser. No. 17/077,081, filed Oct. 22, 2020, which is based on and claims priority under 35 U.S.C. § 119 to Korean Patent Application No. 10-2019-0133275, filed on Oct. 24, 2019, and Korean Patent Application No. 10-2020-0122851, filed on Sep. 23, 2020, in the Korean Intellectual Property Office, the disclosures of which are incorporated by reference herein in their entirety.

BACKGROUND

1. Field

The disclosure relates to a color separation element and an image sensor including the same.

2. Description of Related Art

Color display devices or color image sensors typically display images of various colors or detect colors of incident light by using color filters. For example, a charge-coupled device (CCD) and a complementary metal-oxide semiconductor (CMOS) may be used as an image sensor.

The number of pixels of an image sensor is gradually increasing, and accordingly, size reduction of pixels is demanded. For size reduction of pixels, it is necessary to secure light quantity and to remove noise.

Image sensors typically display images of various colors or detect colors of incident light by using color filters. However, since a color filter absorbs light of colors other than light of a corresponding color, light utilization efficiency may be reduced. For example, in case of using RGB color filters, only one-third of incident light is transmitted therethrough and the remaining two-thirds are absorbed, and thus light use efficiency is only about 33%. In other words, light loss is significant.

Recently, to improve light utilization efficiency of an image sensor, it is being attempted to employ a color separation element instead of a color filter. A color separation element splits colors of incident light by using diffraction or refraction characteristics of light that differs depending on wavelengths, and may adjust directions of light for respective wavelengths according to refractive indexes and shapes. Colors separated by the color separation element may be delivered to corresponding pixels, respectively.

SUMMARY

Provided is a color separation element with improved color purity.

Provided is an image sensor including a color separation element with improved color purity.

Additional aspects will be set forth in part in the description which follows and, in part, will be apparent from the description, or may be learned by practice of the presented embodiments of the disclosure.

According to an aspect of the disclosure, there is provided a color separation element includes a spacer layer; and a color separation lens array, which comprises one or more nano-posts arranged on the spacer layer, the color separation lens array configured to form a phase distribution that splits and focuses light incident to the color separation lens array based on wavelengths of the light, wherein the color separation lens array comprises a plurality of periodic regions in which the one or more nano-posts are repeatedly arranged, and the color separation lens array is configured to interrupt phase distribution at a boundary between adjacent ones of the plurality of periodic regions.

The plurality of periodic regions may include a first periodic region and a second periodic region adjacent to each other, and a first phase distribution formed by a first set of the one or more nano-posts of the color separation lens array in the first periodic region and a second phase distribution formed by a second set of the one or more nano-posts of the color separation lens array in the second periodic region may not overlap at the boundary between the first periodic region and the second periodic region.

The color separation lens array in one periodic region may be configured to form an asymmetrical phase distribution for each wavelength light of the incident light.

The color separation lens array in one periodic region may be configured to form a non-radial phase distribution for each wavelength light of the incident light.

The plurality of periodic regions may include a first region for focusing first wavelength light, a second region for focusing second wavelength light, a third region for focusing third wavelength light, and a fourth region for focusing first wavelength light, the first region and the fourth may be located on a diagonal line, and the second region and a third region may be located on a diagonal line.

The first wavelength light may include green light, the second wavelength light may include blue light, and the third wavelength light may include red light.

The first wavelength light may have a phase of $2N\pi$ (N is an integer greater than 0) at the center of the first region and the phase of the first wavelength light may decrease in directions toward the outside of the periodic region.

The first wavelength light may have a phase of $(2N-1)\pi$ (N is an integer greater than 0) at the center of the second region, and the first wavelength light may have a phase of $(2N-1)\pi$ (N is an integer greater than 0) at the center of the third region.

The color separation lens array may be configured to form a continuous phase distribution within each of the plurality of periodic regions.

According to an aspect of another embodiment, an image sensor includes an optical sensor including a plurality of light detecting cells for sensing light; a spacer layer provided in the optical sensor; and a color separation lens array, which comprises one or more nano-posts arranged on the spacer layer, the color separation lens array configured to form a phase distribution that splits and focuses light incident to the color separation lens array based on wavelengths of the light, wherein the color separation lens array comprises a plurality of periodic regions in which the one or more nano-posts are repeatedly arranged, and the color separation lens array is configured to interrupt phase distribution at the boundary of the plurality of periodic regions.

The image sensor may further include a color filter between the optical sensor and the spacer layer.

The image sensor may further include a photographing lens unit configured to focus light reflected by an object on a light incidence side of the color separation lens array and form an optical image.

BRIEF DESCRIPTION OF THE DRAWINGS

The above and other aspects, features, and advantages of certain embodiments of the disclosure will be more apparent from the following description taken in conjunction with the accompanying drawings, in which:

FIGS. 3A to 3C are diagrams showing example arrangements of periodic regions of a color separation element according to an example embodiment;

DETAILED DESCRIPTION

Figure 1:
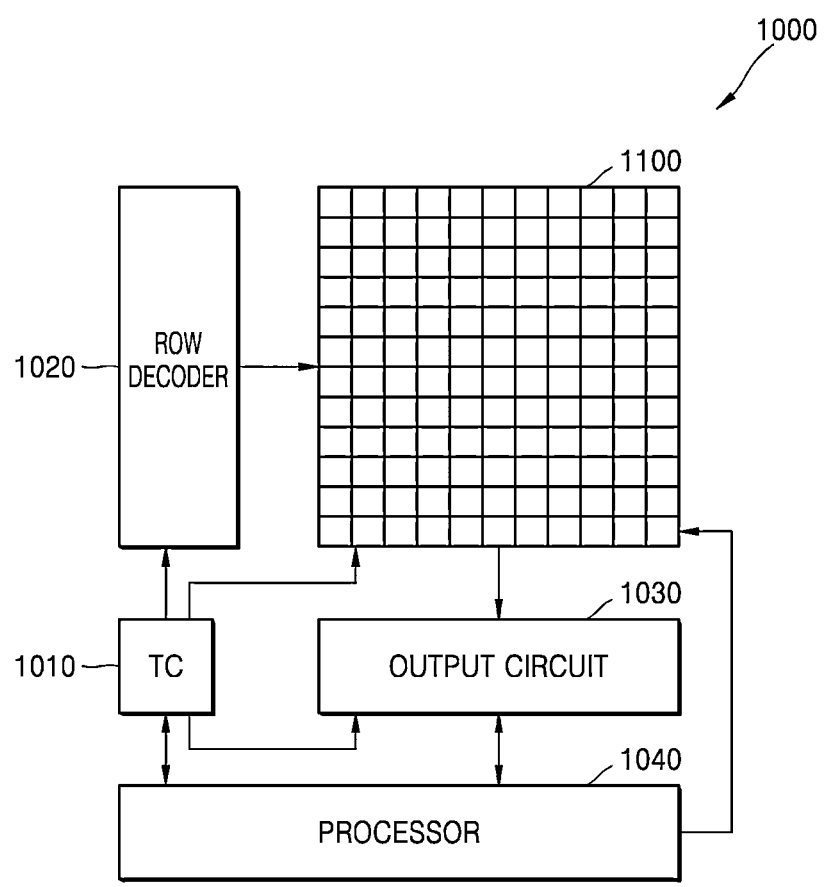
FIG. 1 is a schematic block diagram of an image sensor according to an example embodiment.

Reference will now be made in detail to embodiments, examples of which are illustrated in the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, a color separation element according to various example embodiments and an image sensor including the same will be described in detail with reference to the accompanying drawings. In the drawings, like reference numerals denote like elements, and the size and thickness of each element may be exaggerated for clarity of explanation. While such terms as "first," "second," etc., may be used to describe various elements, such elements must not be limited to the above terms. The above terms are used only to distinguish one component from another.

An expression used in the singular encompasses the expression of the plural, unless it has a clearly different meaning in the context. In addition, unless explicitly described to the contrary, the word "comprise" and variations such as "comprises" or "comprising" will be understood to imply the inclusion of stated elements but not the exclusion of any other elements. Also, the size or the thickness of each component in the drawings may be exaggerated for clarity of description. Also, when it is described that a certain material layer is present on a substrate or other layer, the material layer may be present in direct contact with the substrate or another layer, and there may be another third layer in between. In addition, the materials constituting layers in the following embodiments are merely examples, and other materials may also be used.

In addition, the terms "unit", "-or", and "module" described in the specification mean units for processing at least one function and operation and may be implemented by hardware components or software components and combinations thereof.

The specific implementations described in the example embodiments of the disclosure are illustrative and do not in any way limit the scope of the disclosure. For clarity of description, descriptions of related art electronic configurations, control systems, software, and other functional aspects of such systems may be omitted. Also, connections of lines or connecting members between the components shown in the drawings are example illustrations of functional connections and/or physical or circuit connections, which may be replaced with or additionally provided by various functional connections, physical connections, or circuit connections.

The use of the terms "the" and similar indication words may refer to both singular and plural.

Operations that constitute a method may be performed in any suitable order, unless explicitly stated to be done in an order described. Furthermore, the use of all exemplary terms (e.g., etc.) is merely intended to be illustrative of technical ideas and is not to be construed as limiting the scope of the term unless further limited by the claims.

FIG. 1 is a schematic block diagram of an image sensor according to an example embodiment.

Referring to FIG. 1, an image sensor 1000 according to an example embodiment may include a pixel array 1100, a timing controller (TC) 1010, a row decoder 1020, and an output circuit 1030. The image sensor 1000 may further include a processor 1040, which controls the pixel array 1100, the timing controller 1010, and the output circuit 1030 and processes an image signal output through the output circuit 1030. An image sensor according to an example embodiment may be a charge-coupled device (CCD) image sensor or a complementary metal-oxide semiconductor (CMOS) image sensor.

The pixel array 1100 includes a plurality of pixels 2-dimensionally arranged along a plurality of rows and a plurality of columns. The row decoder 1020 selects any one row from among the plurality of rows of the pixel array 1100 in response to a row address signal output from the timing controller 1010. The output circuit 1030 outputs light detecting signals column by column from a plurality of pixels arranged along the selected row. To this end, the output circuit 1030 may include a column decoder and an analog to digital converter (ADC). For example, the output circuit 1030 may include a plurality of ADCs arranged for respective columns between the column decoder and the pixel array 1100. Alternatively, the output circuit 1030 may include one ADC provided at an output terminal of the column decoder. According to example embodiments, the timing controller 1010, the row decoder 1020, and the output circuit 1030 may be implemented as a single chip or may be implemented as separate chips. A processor for processing an image signal output through the output circuit 1030 may be implemented as a single chip together with the timing controller 1010, the row decoder 1020, and the output circuit 1030.

The pixel array 1100 may include a plurality of pixels for sensing light of different wavelengths. The plurality of pixels for sensing light of different wavelengths may be implemented in various arrangements.

Figure 2:
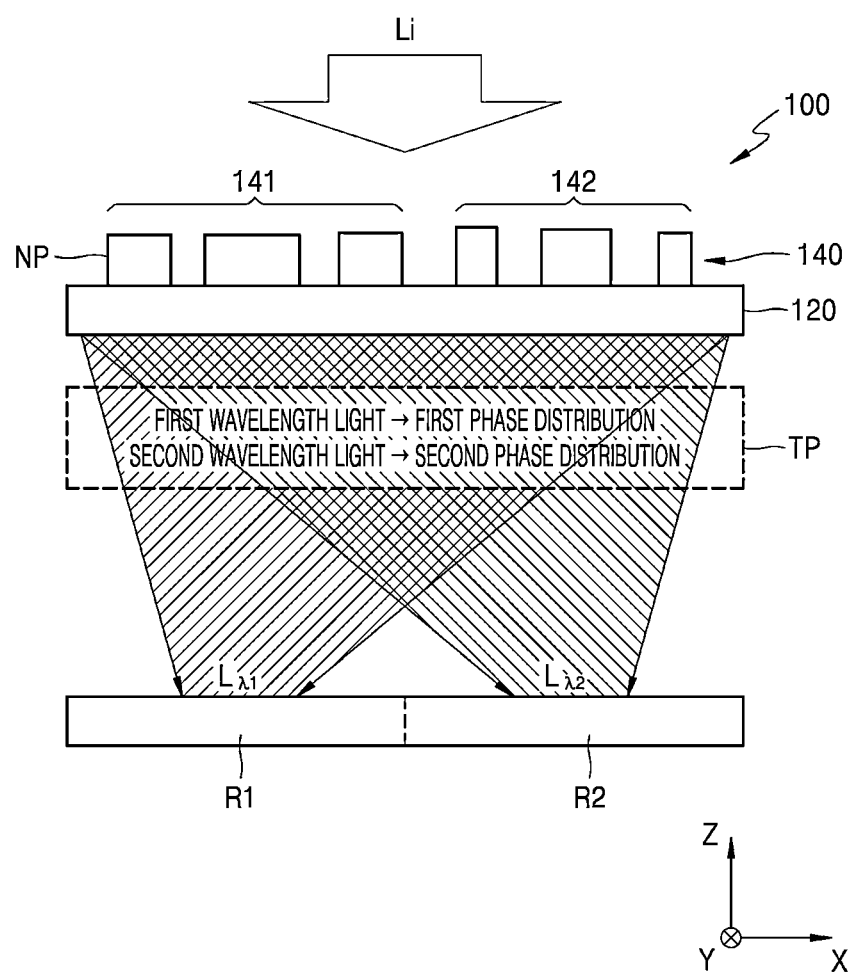
FIG. 2 is a schematic view of a color separation element according to an example embodiment.

FIG. 2 is a schematic view of the structure of a color separation element 100 according to an example embodiment.

In FIG. 2, the color separation element 100 includes a spacer layer 120 and a color separation lens array 140, which is provided in the spacer layer 120 and includes a plurality of nano-posts NPs. The plurality of nano-posts NP may be arranged according to a certain rule. According to an example embodiment, the rule may be a predetermined rule.

Here, the rule is applied to parameters, such as the shape, the size (width and height), the spacing, and the arrangement shape of the nano-posts NP, and the parameters may be determined based on a target phase distribution TP to be implemented by the nano-posts NPs with respect to incident light Li. The target phase distribution TP may be determined in consideration of target regions R1 and R2 to focus the incident light Li by separating the wavelength of the incident light Li. Although the target phase distribution TP is shown between the color separation element 100 and the target regions R1 and R2, it is merely for convenience of illustration, and the target phase distribution TP may refer to a phase distribution of the incident light Li at a location immediately after the incident light Li passes through the color separation lens array 140. The color separation lens array 140 may separate the incident light Li according to respective wavelengths and adjust the phase distribution of light of each wavelength to focus the light of each wavelength to a certain target region R1 or R2.

The nano-posts NPs may include a material having a refractive index higher than that of the surroundings, and the spacer layer 120 may include a material having refractive index lower than that of the nano-posts NPs.

The nano-posts NP may include, for example, at least one of c-Si, p-Si, a-Si, and group III-V compound semiconductors (e.g., GaP, GaN, GaAs, etc.), SiC, $TiO_2$, SiN. The spacer layer 120 may include any one of glass (e.g., fused silica, BK7, etc.), quartz, polymer (e.g., PMMA, SU-8, etc.) and plastic.

The nano-posts NPs having a refractive index different from that of a surrounding material may change the phase of light passing through the nano-posts NP. This is due to a phase delay caused by the shape dimension of a sub-wavelength of the nano-posts NPs, and the degree of the phase delay is determined based on the specific shape dimension and arrangement shape of the nano-posts NPs. The plurality of nano-posts NPs may achieve various optical functions by appropriately setting the degree of a phase delay occurring in each of the plurality of nano-posts NPs.

The color separation element 100 is for splitting the incident light Li according to wavelengths and focusing the split incident light at different target regions R1 and R2, wherein detailed rules of the nano-posts NPs may be determined according to the target phase distribution TP for implementing the focusing at desired locations.

The phase of first wavelength light $L\lambda_1$ at a position immediately after passing through the color separation element 100 may be $2N\pi$ (N is an integer greater than 0) at the center of a position corresponding to a first region 141 and may be $(2N-1)\pi$ (N is an integer greater than 0) at the center of a position corresponding to a second region 142.

The phase of second wavelength light $L\lambda_2$ passed through the color separation lens array 140 may be $(2M-1)\pi$ at the center of the position corresponding to the first region 141 and may be $2M\pi$ at the center of the position corresponding to the second region 142. Here, M is an integer greater than 0.

A first wavelength λ1 and a second wavelength λ2 may be within the visible ray wavelength band. However, the disclosure is not limited thereto, and the first wavelength λ1 and the second wavelength λ2 may be within various wavelength bands according to arrangement rules of the color separation lens array 140. Also, although a case where incident light is split into light beams of two wavelengths and focused is shown, the disclosure is not limited thereto, and incident light may be split into three or more directions according to wavelengths and focused.

The color separation lens array 140 may include the first region 141 and the second region 142, each of which includes one or more nano-posts NPs. The first region 141 and the second region 142 may be respectively arranged to face the first target region R1 and the second target region R2 on the one-on-one basis. Although FIG. 1 shows that three nano-posts NPs are arranged in each of the first region 141 and the second region 142, it is merely an example. Also, although FIG. 1 shows that the nano-posts NPs are entirely located in any one of the first region 141 and the second region 142, the disclosure is not limited thereto, and some of the nano-posts NPs may be arranged at the boundary between the first region 141 and the second region 142. For example, the color separation lens array 140 may be configured to have a first phase distribution with respect to the first wavelength light L$\lambda_1$ of the incident light Li and to focus the first wavelength light L$\lambda_1$ to the first target region R1. Also, the color separation lens array 140 may be configured to have a second phase distribution with respect to the second wavelength light L$\lambda_2$ of the incident light Li and to focus the second wavelength light L$\lambda_2$ to the second target region R2.

Figure 3A:
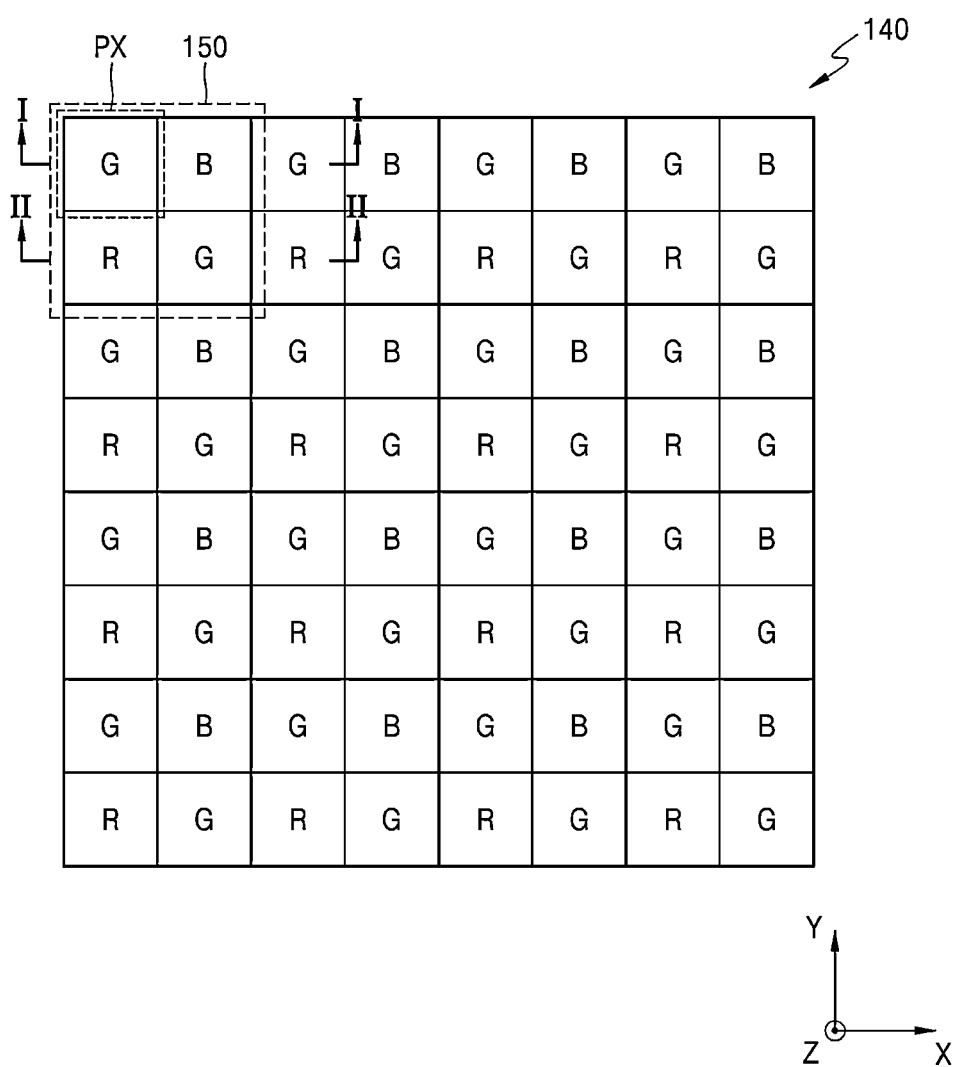

For example, FIGS. 3A to 3C show examples of various pixel arrangements of the pixel array 1100 of the image sensor 1000.

FIG. 3A shows a so-called Bayer pattern. The color separation element 100 may include periodic regions 150 in which elements of color separation lens array 140 are repeatedly arranged. The periodic region 150 may correspond to a repeated arrangement of a plurality of pixels. The periodic regions 150 may be repetitive regions of a minimum unit for splitting the incident light Li by wavelengths. The periodic regions 150 may be 2-dimensionally and repeatedly arranged. For example, the periodic region 150 may correspond to a 2×2 pixel region. A pixel PX may represent a unit capable of sensing light by wavelengths and electrically processing light amounts. The periodic region 150 may be, for example, divided into four regions and may be configured to split the incident light Li into green light G, blue light B, and red light R. According to an example embodiment, the periodic region 150 that is divided into four regions and shown in FIG. 3A is merely for convenience of explanation, and a color separation lens array in the periodic region 150 is not divided into four pieces. The color separation element 100 may be applied to an image sensor, and the image sensor may include, for example, a blue pixel B, a green pixel G, a red pixel R, and a green pixel G. Pixel arrangement as described above may be 2-dimensionally repeated in a first direction (X direction) and a second direction (Y direction). In other words, in a unit pixel in the form of a 2×2 array, two green pixels G are arranged in one diagonal direction, and one blue pixel B and one red pixel R are arranged in the other diagonal direction. In terms of the overall pixel arrangement, first rows in which a plurality of green pixels G and a plurality of blue pixels B are alternately arranged in the first direction and second rows in which a plurality of red pixels R and a plurality of green pixels G are alternately arranged in the first direction are repeatedly arranged in the second direction. Here, the same reference numerals are used for pixels and light of respective wavelengths.

The arrangement scheme of the pixel array 1100 of the image sensor 1000 is not limited to the Bayer pattern, and various arrangement schemes other than the Bayer pattern may be applied. For example, referring to FIG. 3B, a CYGM scheme in which a magenta pixel M, a cyan pixel C, a yellow pixel Y, and a green pixel G constitute one unit pixel may also be applied. Also, referring to FIG. 3C, an RGBW scheme in which a green pixel G, a red pixel R, a blue pixel B, and a white pixel W constitute one unit pixel may also be applied. Also, although not shown, a unit pixel may be in the form of a 3×2 array. Also, pixels of the pixel array 1100 may be arranged in various ways according to the color characteristics of the image sensor 1000. Hereinafter, for convenience of explanation, it is described below that the pixel array 1100 of the image sensor 1000 has a Bayer pattern. However, the principles of the example embodiments described below may be applied to pixel arrangements other than the Bayer pattern.

The color separation element described above may be applied to various image sensors. Hereinafter, an example embodiment in which the color separation element is applied to an image sensor will be described.

Figure 4:
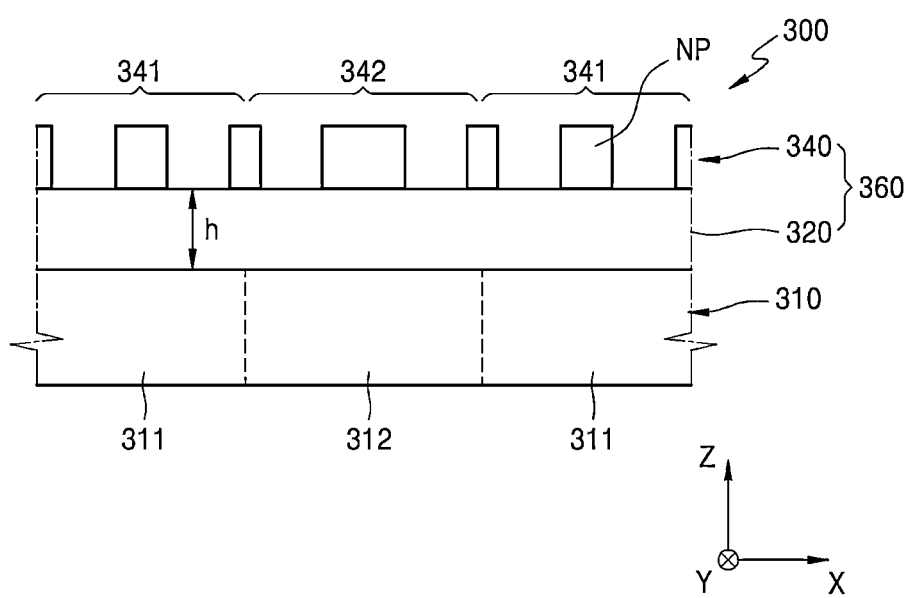
FIGS. 4 and 5 are schematic views of an image sensor according to an example embodiment.
Figure 5:
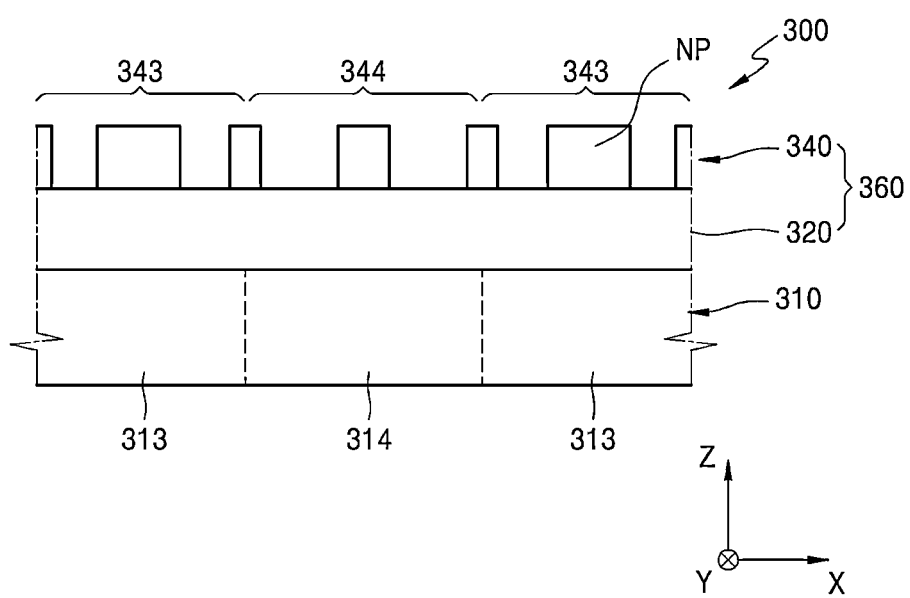

FIGS. 4 and 5 are diagrams showing different cross-sections of the schematic structure of an image sensor according to an example embodiment. Referring to the pixel arrangement structure of FIG. 3A, FIG. 4 may be a cross-sectional view obtained along a line I-I, and FIG. 5 may be a cross-sectional view obtained along a line II-II.

An image sensor 300 may include an optical sensor 310, which includes a plurality of light detecting cells 311, 312, 313, and 314 for detecting light, and a color separation element 360 provided on the optical sensor 310.

The optical sensor 310 may include a first light detecting cell 311, a second light detecting cell 312, a third light detecting cell 313, and a fourth light detecting cell 314 for converting light into electrical signals. The first light detecting cell 311, the second light detecting cell 312, the third light detecting cell 313, and the fourth light detecting cell 314 may be alternately arranged. As shown in FIG. 4, first light detecting cells 311 and second light detecting cells 312 may be alternately arranged in the first direction (the X direction), and, as shown in FIG. 5, third light detecting cells 313 and fourth light detecting cells 314 may be alternately arranged in the first direction (the X direction) in a different cross-section in the Y direction, that is, a cross-section. This regional division is for sensing incident light pixel-by-pixel. For example, the first light detecting cell 311 may sense light of a first wavelength corresponding to a first pixel, the second light detecting cell 312 may sense light of a second wavelength corresponding to a second pixel, the third light detecting cell 313 may sense light of a third wavelength corresponding to a third pixel, and the fourth light detecting cell 314 may sense light of a fourth wavelength corresponding to a fourth pixel. The first pixel, the second pixel, the third pixel, and the fourth pixel may respectively be a green pixel G, a blue pixel B, a red pixel R, and a green pixel G, but are not limited thereto. Although not shown, isolation films may be further provided at the boundaries between pixels.

The color separation element 360 includes a color separation lens array 340 in which a plurality of nano-posts NPs are arranged according to a certain rule. The color separation lens array 340 may be supported by a spacer layer 320. The spacer layer 320 may be provided to maintain a certain distance between the optical sensor 310 and the plurality of nano-posts NPs. Also, although not shown, a dielectric layer for protecting the plurality of nano-posts NPs may be further provided. The dielectric layer may have a height same as or greater than that of the nano-post NP and may be provided around the nano-post NP. The dielectric layer may include a dielectric material having a refractive index lower than that of a material constituting the nano-posts NP.

The shape, the size, and the arrangement of the plurality of nano-posts NPs may be configured to form a phase distribution for focusing light beams of different wavelengths to the first light detecting cell 311 and the second light detecting cell 312 adjacent to each other, respectively. Also, the shape, the size, and the arrangement of the plurality of nano-posts NPs may be configured to form a phase distribution for focusing light beams of different wavelengths to the third light detecting cell 313 and the first light detecting cell 311 adjacent to each other, respectively.

The color separation lens array 340 may be divided into a plurality of regions 341, 342, 343, and 344 that face the plurality of light detecting cells 311, 312, 313, and 314, respectively. One or more nano-posts NPs may be arranged in each of the plurality of regions 341, 342, 343, and 344, and at least one of the shape, the size, and the arrangement of the nano-posts NPs may vary from one region to another.

As shown in FIGS. 4 and 5, the first region 341 and the first light detecting cell 311 may be arranged to correspond to each other, the second region 342 and the second light detecting cell 312 may be arranged to correspond to each other, the third region 343 and the third light detecting cell 313 may be arranged to correspond to each other, and the fourth region 344 and the fourth light detecting cell 314 may be arranged to correspond to each other.

The color separation lens array 340 may split incident light, such that light of the first wavelength is focused to the first light detecting cell 311, light of the second wavelength is focused to the second light detecting cell 312, light of the third wavelength is focused to the third light detecting cell 313, and light of the first wavelength is focused to the fourth light detecting cell 314. Also, the color separation lens array 340 may allow the phase of light of each wavelength to be continuously distributed within the periodic region 150 of pixels and block phase distribution at the boundary of the periodic region 150. As a result, light of different wavelengths may be prevented from being mixed at the boundary between neighboring periodic regions 150, thereby improving color purity. Detailed description thereof will be given below.

Figure 6:
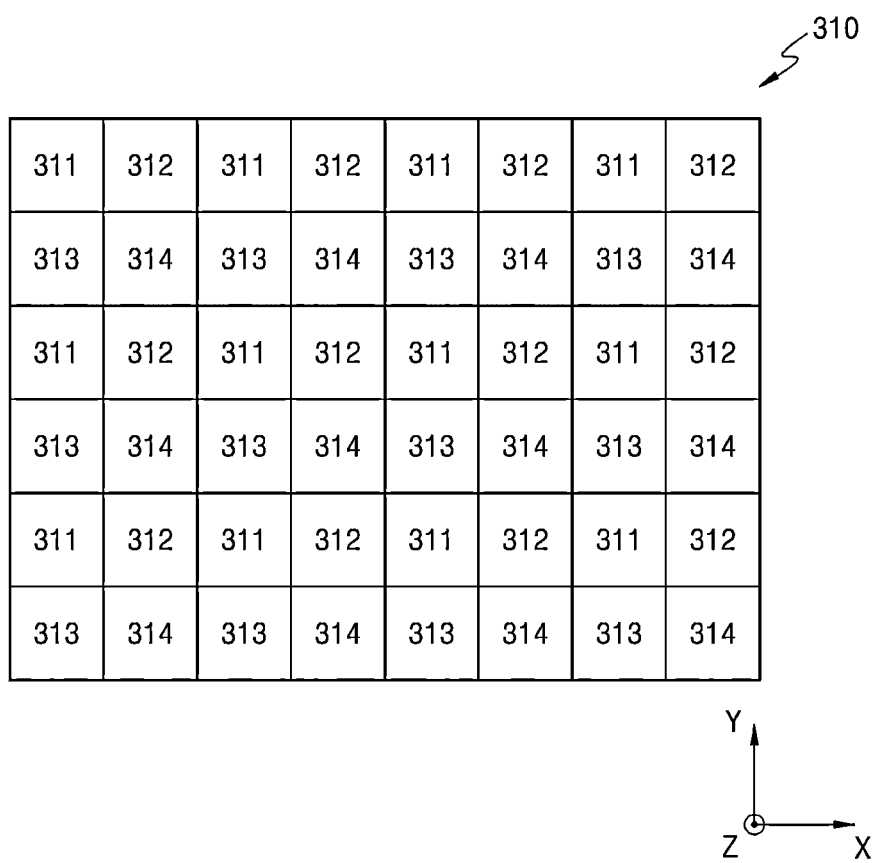
FIG. 6 is a schematic plan view of an optical sensor included in an image sensor according to an example embodiment.

FIG. 6 is a plan view of the light sensor 310. Referring to FIG. 6, first rows in which first light detecting cells 311 and second light detecting cells 312 are alternately arranged and second rows in which the third light detecting cells 313 and the fourth light detecting cells 314 are alternately arranged may be repeated arranged. In the light sensor 310, a plurality of first light detecting cells 311, a plurality of second light detecting cells 312, a plurality of third light detecting cells 313, and a plurality of fourth light detecting cells 314 may be 2-dimensionally arranged in the first direction (X direction) and the second direction (Y direction). For example, referring to FIGS. 3A and 6, the first light detecting cell 311 and the fourth light detecting cell 314 may correspond to the green pixel G, the second light detecting cell 312 may correspond to the blue pixel B, and the third light detecting cell 313 may correspond to the red pixel R.

The illustrated arrangement rule of the color separation lens array 340 is an example for implementing a target phase distribution for splitting incident light, such that light of a first wavelength is focused to the first light detecting cell 311 and the fourth light detecting cell 314, light of a second wavelength is condensed to the second light detecting cell 312, and light of a third wavelength is condensed to the third light detecting cell 313, but is not limited thereto.

The shapes, the sizes, and the arrangements of the nano-posts NP arranged in the first region 341, the second region 342, the third region 343, and the fourth region 344 may be determined, such that a phase inducing light of the first wavelength to be focused at the first light detecting cell 311 and the fourth light detecting cell 314 at a position past the color separation lens array 340 and preventing light of the first wavelength from being focused at the second light detecting cell 312 and the third light detecting cell 313 adjacent to the first light detecting cell 311 and the fourth light detecting cell 314 is formed at a position immediately after passing through the color separation lens array 340.

Similarly, the shapes, the sizes, and the arrangements of the nano-posts NP arranged in the first region 341, the second region 342, the third region 343, and the fourth region 344 may be determined, such that a phase inducing light of the second wavelength to be focused at the second light detecting cell 312 and preventing light of the second wavelength from being focused at the first light detecting cell 311, the third light detecting cell 313, and the fourth light detecting cell 314 adjacent to the second light detecting cell 312 is formed at a position immediately after passing through the color separation lens array 340.

Similarly, the shapes, the sizes, and the arrangements of the nano-posts NP arranged in the first region 341, the second region 342, the third region 343, and the fourth region 344 may be determined, such that a phase inducing light of the third wavelength to be focused at the third light detecting cell 313 and preventing light of the third wavelength from being focused at the first light detecting cell 311, the second light detecting cell 312, and the fourth light detecting cell 314 adjacent to the third light detecting cell 313 is formed at a position immediately after passing through the color separation lens array 340.

The shapes, the sizes, and the arrangements of the nano-posts NP that satisfy all of these conditions may be determined, and the color separation lens array 340 having the same may allow light to have the following target phase distribution immediately after passing through the same. At a position immediately after passing through the color separation lens array 340, that is, on the bottom surface of the color separation lens array 340 or the top surface of the spacer layer 320, the phase of the light of the first wavelength may be a distribution that exhibits a phase difference of $2N\pi$ at the center portion of the first region 341 corresponding to the first light detecting cell 311 and the center portion of the fourth region 344 corresponding to the fourth light detecting cell 314 and exhibits a phase difference of $(2N-1)\pi$ at the center portion of the second region 342 corresponding to the second light detecting cell 312 and the center portion of the third region 343 corresponding to the third light detecting cell 313. Here, N is an integer greater than 0.

In other words, at the position immediately after passing through the color separation lens array 340, the phase of the light of the first wavelength may become maximum at the center of the first region 341 and the center of the fourth region 344, decrease in concentric-circular shape as distances from the center of the first region 341 and the center of the fourth region 344 increase, and become minimum at the center of the second region 342 and the center of the third region 343. In the example embodiment, a plurality of first regions 341 are provided adjacent to one another, and a phase difference of $2N\pi$ may be exhibited at the center of every first region 341. A plurality of fourth regions 344 are provided adjacent to one another, and a phase difference of $2N\pi$ may be exhibited at the center of every fourth region 344. For example, when N=1, at the position after passing through the color separation lens array 340, the phase of the light of the first wavelength may be $2\pi$ at the center of the first region 341 and the center of the fourth region 344 and may be $\pi$ at the center of the second region 342 and the center of the third region 343. Here, the phase may refer to a relative phase value after light passed through the nano-post NP with respect to a phase immediately before passing through the nano-post NP.

Also, at the position after passing through the color separation lens array 340, the phase of the light of the second wavelength may be $2M\pi$ at the center of the second region 342 corresponding to the second light detecting cell 312 and may be $(2M-1)\pi$ at the center of the first region 341 corresponding to the first light detecting cell 311, at the center of the fourth region 344 corresponding to the fourth light detecting cell 314, and at the center of the third region 343 corresponding to the third light detecting cell 313. Here, M is an integer greater than 0. In other words, at the position immediately after passing through the color separation lens array 340, the phase of the light of the second wavelength may become maximum at the center of the second region 342, decrease in concentric-circular shape as a distance from the center of the second region 342 increases, and become minimum locally at the centers of the first region 341, the fourth region 344, and the third region 343. For example, when M=1, at the position after passing through the color separation lens array 340, the phase of the light of the second wavelength may be a at the center of the second region 342, may be $\pi$ at the center of the first region 341 and the center of the fourth region 344, and may be from about $0.2\pi$ to about $0.7\pi$ at the center of the third region 343.

Also, similarly, at the position after passing through the color separation lens array 340, the phase of the light of the third wavelength may be $2L\pi$ at the center of the third region 34 corresponding to the third light detecting cell 313, may be $(2L-1)\pi$ at the center of the first region 341 corresponding to the first light detecting cell 311, at the center of the fourth region 344 corresponding to the fourth light detecting cell 314, and at the center of the second region 342 corresponding to the second light detecting cell 312, and may be greater than $(2L-2)\pi$ and smaller than $(2L-1)\pi$ at the center of the second region 342 corresponding to the second light detecting cell 312. Here, L is an integer greater than 0. In other words, at the position immediately after passing through the color separation lens array 340, the phase of the light of the third wavelength may become maximum at the center of the third region 343, decrease in concentric-circular shape as a distance from the center of the third region 343 increases, and become minimum locally at the centers of the first region 341, the fourth region 344, and the second region 342. For example, when L=1, at the position after passing through the color separation lens array 340, the phase of the light of the third wavelength may be a at the center of the third region 343, may be $\pi$ at the center of the first region 341 and the center of the fourth region 344, and may be from about $0.2\pi$ to about $0.7\pi$ at the center of the second region 342. Here, the above-stated target phase distribution refers to a phase distribution of light at the position immediately after passing through the color separation lens array 340. When light having such a phase distribution reaches the first light detecting cell 311, the second light detecting cell 312, the third light detecting cell 313, and the fourth light detecting cell 314 from the color separation lens array 340, light having wavelengths corresponding to respective positions may be focused. Then, light that has passed through the color separation lens array 340 may be diverged according to the wavelengths, travel in different directions, and be focused.

When light of such a phase distribution travels toward the plurality of light detecting cells 311, 312, 313, and 314, a certain propagation distance condition may be set, such that light of the first wavelength is diverged toward the first light detecting cell 311 and the fourth light detecting cell 314, light of the second wavelength is diverged toward the second light detecting cell 312, and light of the third wavelength is diverged toward the third light detecting cell 313 to be focused at corresponding cells. Accordingly, a thickness h of the spacer layer 320 may be determined. The thickness h of the spacer layer 320 may depend on a wavelength $\lambda$ of light to be diverged or a pixel size. The thickness h of the spacer layer 320 may be greater than the wavelength $\lambda$ of light to be diverged. For example, the thickness h of the spacer layer 320 may be greater than the center wavelength $\lambda$ of the visible ray wavelength band. The thickness h of the spacer layer 320 may be 1$\lambda$ or greater. The thickness h of the spacer layer 320 may depend on an arrangement period p of light detecting cells. The period p may be expressed as a distance between centers of light detecting cells adjacent to each other. The thickness h of the spacer layer 320 may have a range from 1p to 3p. The thickness h of the spacer layer 320 may have a range from about 500 nm to about 5 μm, for example.

Figure 7:
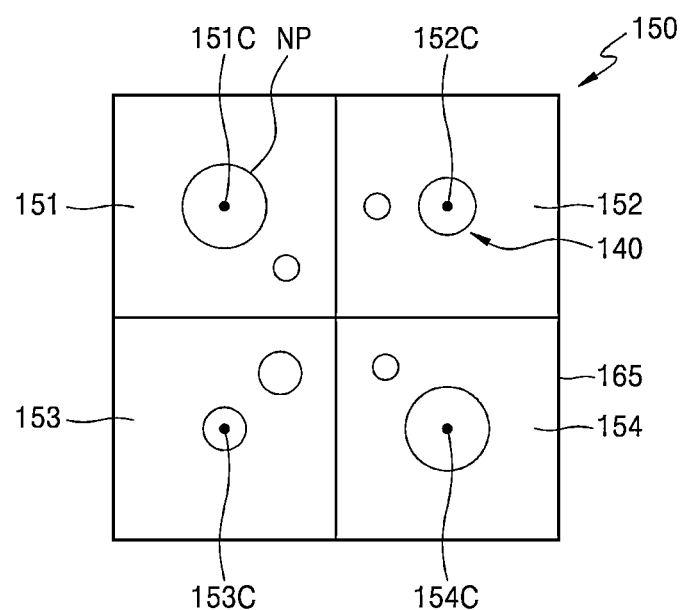
FIG. 7 is a diagram showing an example of a periodic region of a color separation element according to an example embodiment.

FIG. 7 is a schematic view of the periodic region 150 of a color separation lens array. The periodic region 150 may include, for example, a first region 151, a second region 152, a third region 153, and a fourth region 154. The first region 151 may be a pixel region corresponding to first wavelength light (e.g., green light), the second region 152 may be a pixel region corresponding to second wavelength light (e.g., blue light), the third region 153 may be a pixel region corresponding to third wavelength light (e.g., red light), and the fourth region 154 may be a pixel region corresponding to fourth wavelength light (e.g., green light). For example, the first wavelength light may include green light, the second wavelength light may include blue light, the third wavelength light may include red light, and the fourth wavelength light may include green light. The first region 151 and the fourth region 154 may be positioned on a diagonal line, and the second region 152 and the third region 153 may be positioned on a diagonal line.

The nano-posts NPs are arranged in the periodic region 150, and phase distribution of light passing through the periodic region 150 may be controlled by the nano-posts NPs. A phase distribution region may be a region immediately after passing through the color separation lens array 340. The color separation lens array 340 may adjust the phase distribution of any one wavelength light in a region of the corresponding wavelength light, and may adjust the phase distribution to be interrupted at a boundary 165 of the periodic region 150.

According to an example embodiment, a rule in which the nano-posts NPs are arranged in the first region 151, a rule in which the nano-posts NPs are arranged in the second region 152, a rule in which the nano-posts NPs are arranged in the third region 153, and a rule in which the nano-posts NPs are arranged in the fourth region 154 may be different from one another. Alternatively, when the first region 151 and the fourth region 154 are regions for the green light G, the nano-posts NP in the first region 151 and the fourth region 154 may be arranged origin-symmetrically. However, the arrangement of the nano-posts NPs is not limited thereto, and various arrangements may be applied. The nano-posts NP may have a shape dimension of the sub-wavelength. Here, the sub-wavelength means a wavelength smaller than a wavelength band to split. The nano-posts NP may have, for example, a shape dimension smaller than the shortest wavelength from among a first wavelength, a second wavelength, and a third wavelength.

According to an example embodiment, a first nano-post NP may be arranged in a center 151C of the first region 151, a second nano-post NP may be arranged in a center 152C of the second region 152, a third nano-post NP may be arranged in a center 153C of the third region 153, and a fourth nano-post NP may be arranged in a center 154C of the first region 154.

Figure 8:
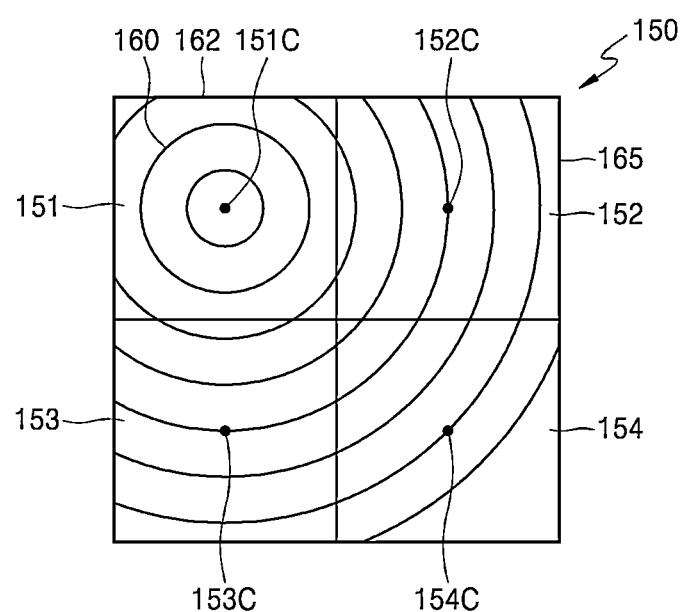
FIG. 8 is a schematic view of a phase distribution for first wavelength light in a periodic region of a color separation element according to an example embodiment.

FIG. 8 is a diagram showing, for example, a phase distribution 160 of first wavelength light of light passing through the periodic region 150. Here, the periodic region 150 represents a periodic region in which the nano-posts NPs are arranged and may be used to indicate a pixel region corresponding thereto. Furthermore, the periodic region 150 may indicate a corresponding region of an optical sensor as a target region for focusing light that has passed through the color separation lens array. The first wavelength light has the phase distribution 160 in which the phase gradually decreases in outward directions from a center 151C of the first region 151, wherein the phase distribution may be interrupted at the boundary 165 of the periodic region 150. The phase at the center 151C of the first region 151 may be 2Nπ (N is an integer greater than 0), and the phase may decrease in outward directions. For example, the phase at the center 151C of the first region 151 may be 2Nπ (N is an integer greater than 0), and the phases at centers 152C and 153C of the second region 152 and the third region 153 adjacent thereto may each be 2(N−1)π (n is an integer greater than 0). However, the disclosure is not limited thereto, and various modifications may be made therein. The phase may be continuously changed in the periodic region 150, and the phase may be interrupted at the boundary 165 of the periodic region 150. In an example embodiment, the color separation lens array 340 may be configured to distribute phases asymmetrically and non-radially with respect to the center 151C of the first region 151.

Figure 9:
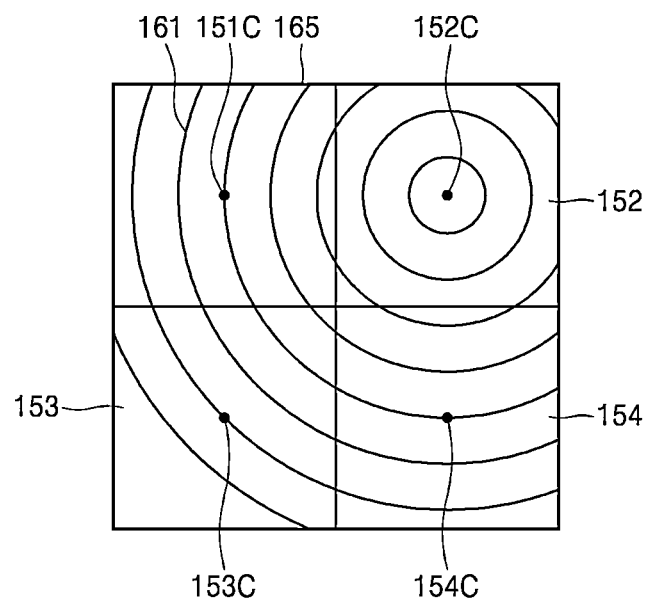
FIG. 9 is a schematic view of a phase distribution for second wavelength light in a periodic region of a color separation element according to an example embodiment.

FIG. 9 is a diagram showing, for example, a phase distribution 161 of second wavelength light of light passing through the periodic region 150. The second wavelength light has the phase distribution 161 in which the phase gradually decreases in outward directions from a center 152C of the second region 152, wherein the phase distribution may be interrupted at the boundary 165 of the periodic region 150. The phase at the center 152C of the second region 152 may be 2Mπ (M is an integer greater than 0), and the phases at centers 151C and 154C of the first region 151 and the fourth region 154 adjacent thereto may each be 2(M−1)π (M is an integer greater than 0). However, the disclosure is not limited thereto, and various modifications may be made therein. The phase may be continuously changed in the periodic region 150, and the phase may be interrupted at the boundary 165 of the periodic region 150. In an example embodiment, the color separation lens array 140 may be configured to distribute phases asymmetrically and non-radially with respect to the center 152C of the second region 152.

According to another example embodiment, the third wavelength light may have the phase distribution in which the phase gradually decreases in outward directions from a center 153C of the third region 153, wherein the phase distribution may be interrupted at the boundary 165 of the periodic region 150. The phase at the center 153C of the third region 153 may be 2Lπ (L is an integer greater than 0), and the phases at centers 151C and 154C of the first region 151 and the fourth region 154 adjacent thereto may each be 2(L−1)π (L is an integer greater than 0). Also, the first wavelength light has the phase distribution in which the phase gradually decreases in outward directions from a center 154C of the fourth region 154, wherein the phase distribution may be interrupted at the boundary 165 of the periodic region 150.

Figure 10:
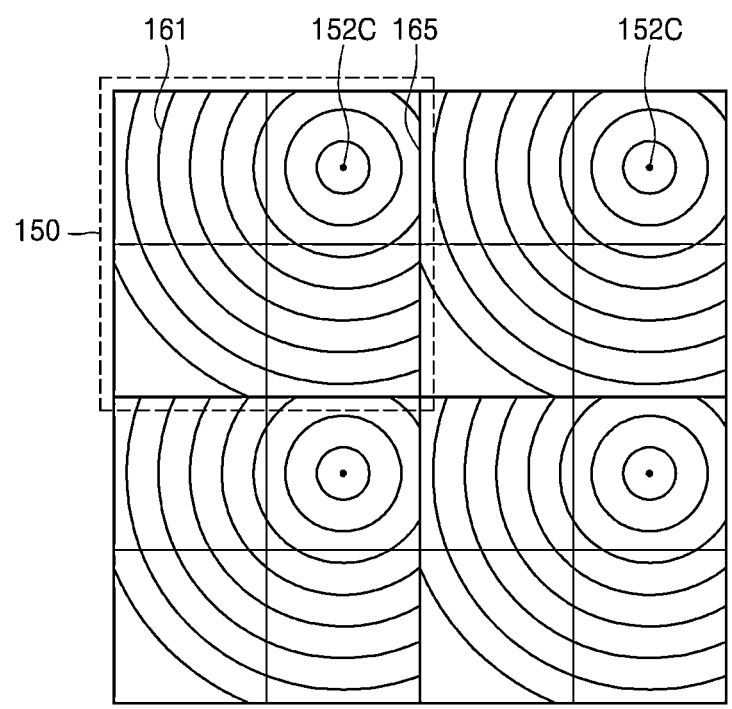
FIG. 10 is a schematic view of a phase distribution for second wavelength light in a periodic region having a 2×2 arrangement structure of a color separation element according to an example embodiment.

FIG. 10 is a diagram showing an example in which a plurality of periodic regions 150 are arranged and showing the phase distribution 161 for second wavelength light in each periodic region 150. Referring to FIG. 10, the phase of the second wavelength light is continuously distributed in each periodic region 150 and is interrupted at the boundary of the periodic region 150. At the boundary 165 of two neighboring periodic regions, phase distributions formed by color separation lens arrays in the respective periodic regions may not overlap each other. Although FIG. 10 shows the phase distribution for the second wavelength light, phases may be distributed on the same principle for the first wavelength light, the third wavelength light, and the fourth wavelength light.

Figure 11A:
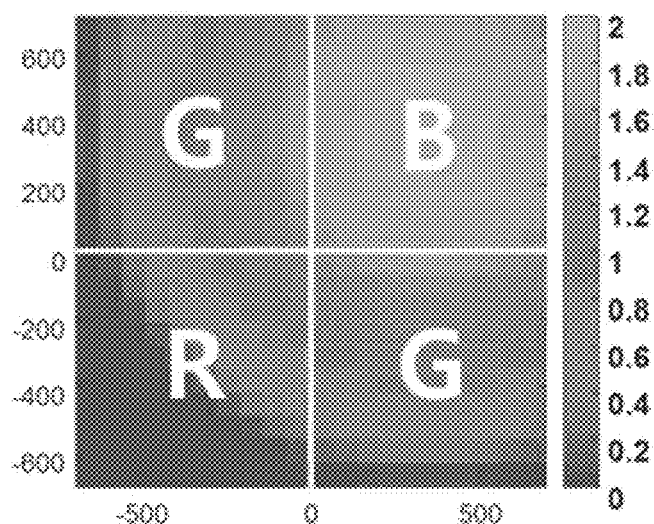
FIGS. 11A and 11B are diagrams showing a phase distribution for blue light in one periodic region and a phase distribution for blue light in a periodic region having a 3×3 arrangement structure.

FIG. 11A shows a phase distribution for the blue light B in one periodic region, wherein the phase of which is, for example, 2π at the center of the blue light region B, the phase decreases in directions toward the outside, and the phase distribution is interrupted at the boundary of the periodic region. For convenience of explanation, the same reference numeral will be used for blue light and a blue light region. The interruption of the phase distribution may indicate that the phase is not distributed at the boundary of the periodic region.

Figure 11B:
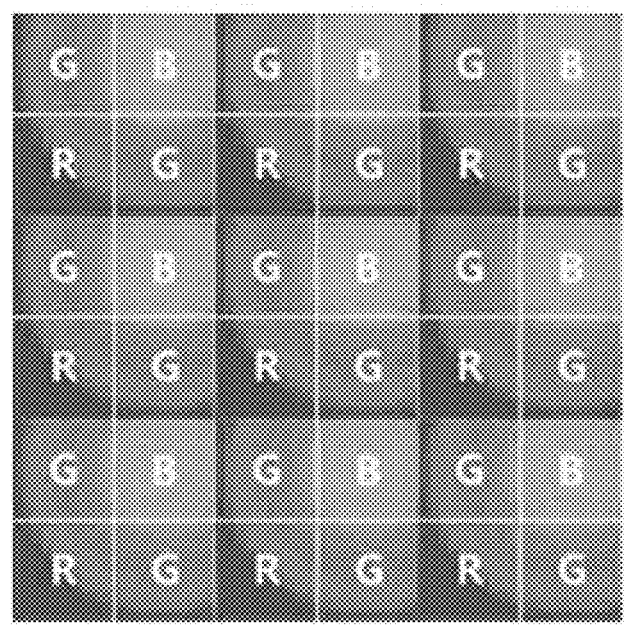

FIG. 11B shows that periodic distributions are arranged 3 by 3 and shows phase distribution of the blue light B in each periodic region. It is shown that the phase distribution of the blue light B is continuously changed in each periodic region, and the phase distribution of the blue light B is interrupted at the boundary of each periodic region. Therefore, mixing of different color lights in neighboring periodic regions may be reduced.

Figure 12A:
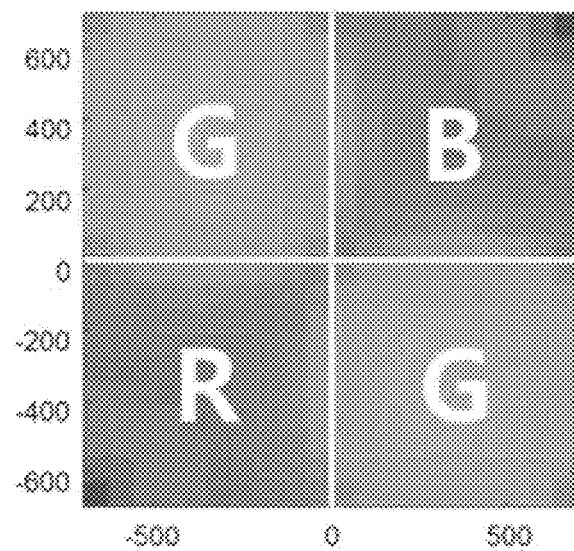
FIGS. 12A and 12B are diagrams showing a phase distribution for green light in one periodic region and a phase distribution for green light in a periodic region having a 3×3 arrangement structure.

FIG. 12A shows a phase distribution for the green light G in one periodic region, wherein the phase of which is, for example, a at the center of the green light region G, the phase decreases in directions toward the outside, and the phase distribution is interrupted at the boundary of the periodic region.

Figure 12B:
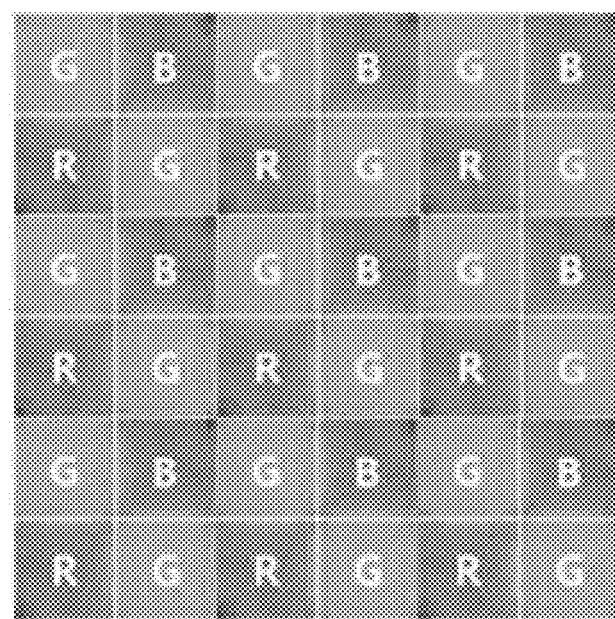

FIG. 12B shows that periodic distributions are arranged 3 by 3 and shows phase distribution of the green light G in each periodic region. It is shown that the phase distribution of the green light G is interrupted at the boundary of each periodic region.

Figure 13A:
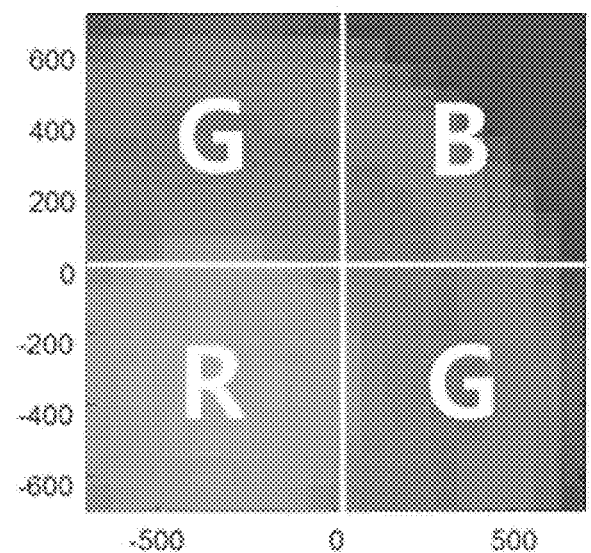
FIGS. 13A and 13B are diagrams showing a phase distribution for red light in one periodic region and a phase distribution for red light in a periodic region having a 3×3 arrangement structure.

FIG. 13A shows a phase distribution for the red light R in one periodic region, wherein the phase of which is, for example, a at the center of the red light region R, the phase decreases in directions toward the outside, and the phase distribution is interrupted at the boundary of the periodic region.

Figure 13B:
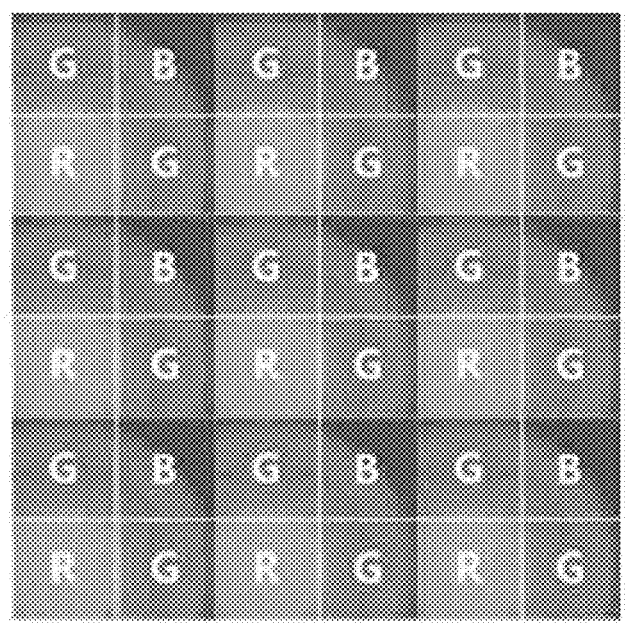

FIG. 13B shows that periodic distributions are arranged 3 by 3 and shows phase distribution of the red light R in each periodic region. It is shown that the phase distribution of the red light R is interrupted at the boundary of each periodic region.

According to an example embodiment, the color separation lens array 340 may form a phase distribution for splitting light of two or more different wavelengths included in incident light in different directions and focusing the same. For example, the shape, the size, and the arrangement of the nano-posts NPs may be configured, such that first wavelength light included in incident light has a first phase distribution, second wavelength light has a second phase distribution, and third wavelength light has a third phase distribution.

Figure 14:
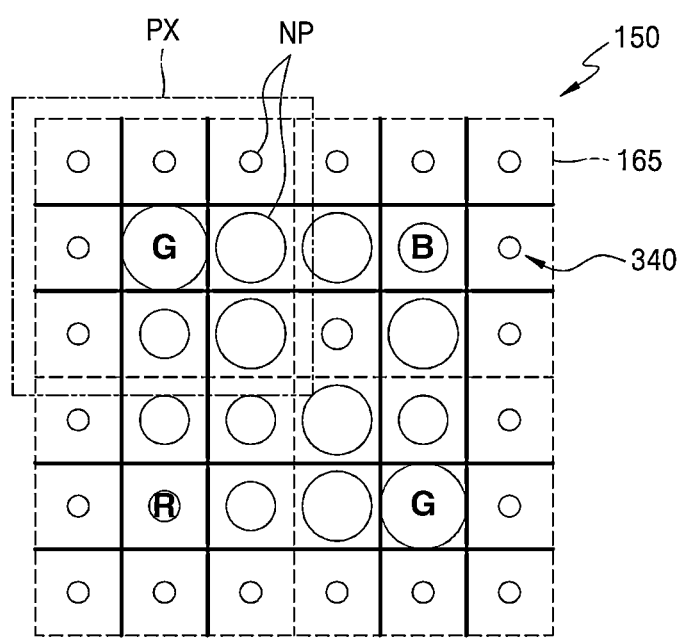
FIGS. 14 to 17 are diagrams showing nano-post arrangement structures of a color separation lens array employed in a color separation element according to example embodiments.

FIG. 14 is a diagram showing an example of an arrangement of the nano-posts NPs in the periodic region 150.

The periodic region 150 of the color separation lens array 340 may include, for example, four pixels PX in a form corresponding to the pixel arrangement of the Bayer pattern and may include four regions including a region G corresponding to a green pixel, a region B corresponding to a blue pixel, a region G corresponding to a green pixel, and a region R corresponding to a red pixel.

Each region may be divided into a plurality of sub-regions, and the nano-posts NPs may be arranged in the sub-regions. Here, nine sub-regions may be provided in each pixel PX, and the nano-posts NP may be arranged in the sub-regions.

Figure 15:
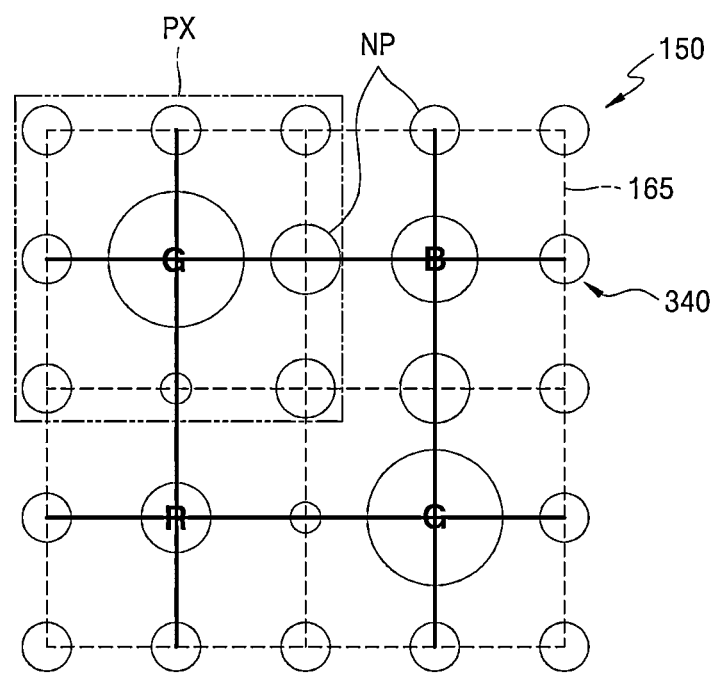

FIG. 15 is a diagram showing another example of nano-post arrangement of a color separation lens array.

The periodic region 150 of the color separation lens array 340 includes four pixels PX in a form corresponding to the pixel arrangement of the Bayer pattern shown in FIG. 3A. Each pixel PX may be divided into a plurality of sub-regions, and the nano-posts NPs may be arranged at points where the boundaries of the sub-regions intersect. In FIG. 15, the number of sub-regions is shown as 4.

Figure 16:
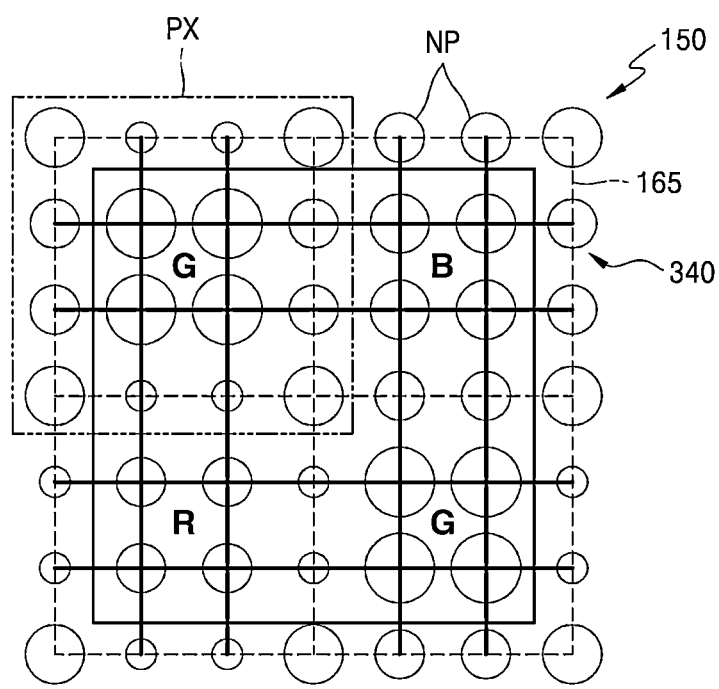

FIG. 16 is a diagram showing another example of nano-post arrangement of a color separation lens array.

The periodic region 150 of the color separation lens array 340 includes four pixels PX in a form corresponding to the pixel arrangement of the Bayer pattern shown in FIG. 3A. Each pixel PX may be divided into a plurality of sub-regions, and the nano-posts NPs may be arranged at points where the boundaries of the sub-regions intersect. In FIG. 16, the number of sub-regions is shown as 9.

Figure 17:
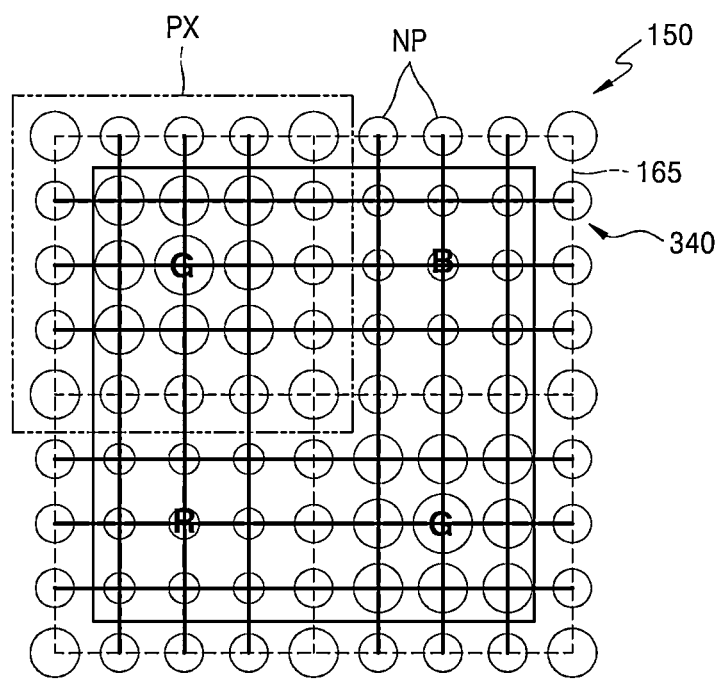

FIG. 17 is a diagram showing another example of nano-post arrangement of a color separation lens array.

The periodic region 150 of the color separation lens array 340 includes four pixels PX in a form corresponding to the pixel arrangement of the Bayer pattern shown in FIG. 3A. Each pixel PX may be divided into a plurality of sub-regions, and the nano-posts NPs may be arranged at points where the boundaries of the sub-regions intersect. In FIG. 17, the number of sub-regions is shown as 25.

Figure 18A:
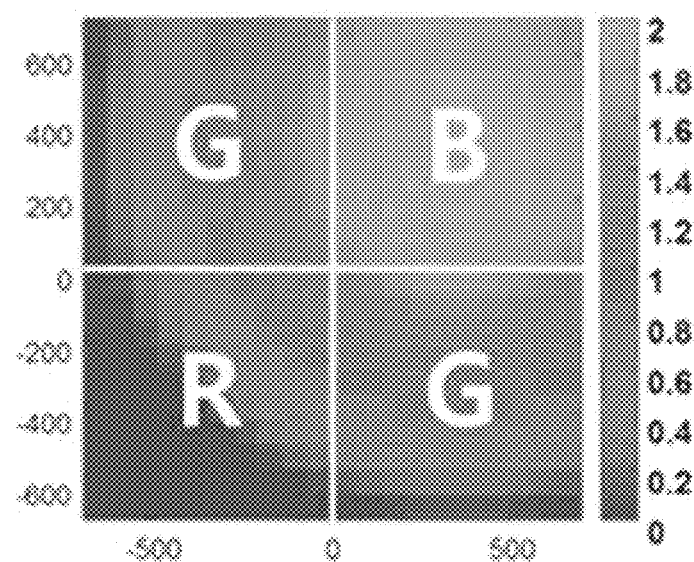
FIG. 18A shows a phase distribution for a region corresponding to blue light in an image sensor according to an example embodiment.
Figure 18B:
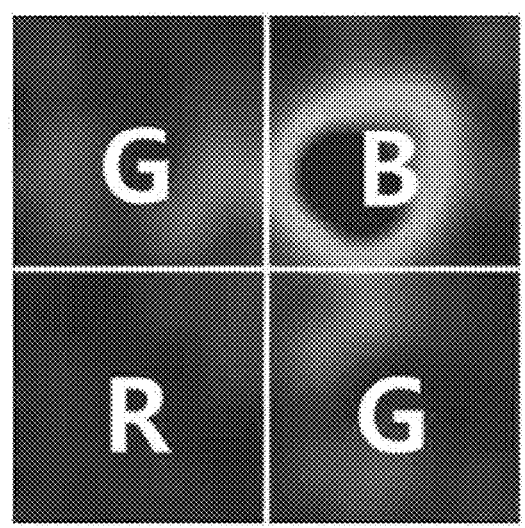
FIG. 18B shows that the blue light is focused according to the phase distribution.

FIG. 18A shows a phase distribution for a region corresponding to the blue light B in an image sensor according to an example embodiment, and FIG. 18B shows that the blue light B is focused according to the phase distribution.

Figure 19A:
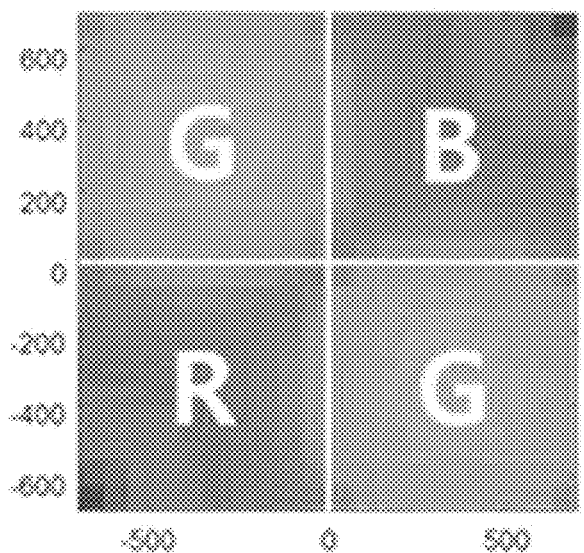
FIG. 19A shows a phase distribution for a region corresponding to green light in an image sensor according to an example embodiment.
Figure 19B:
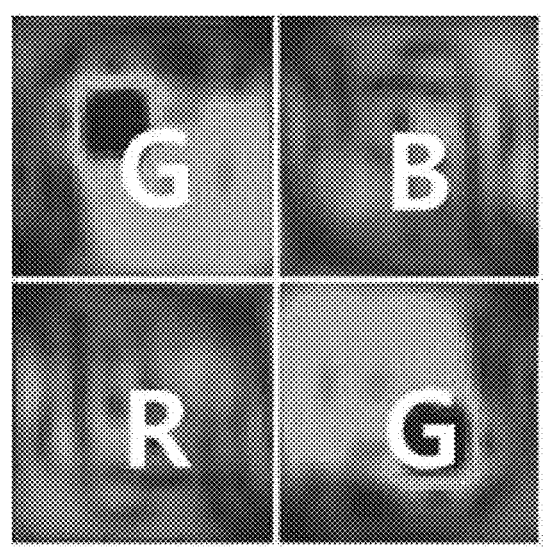
FIG. 19B shows that the green light is focused according to the phase distribution.

FIG. 19A shows a phase distribution for a region corresponding to the green light G in an image sensor according to an example embodiment, and FIG. 19B shows that the green light G is focused according to the phase distribution.

Figure 20A:
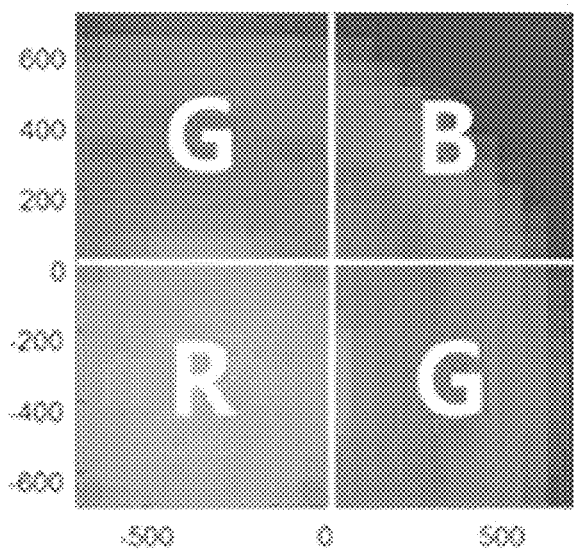
FIG. 20A shows a phase distribution for a region corresponding to red light in an image sensor according to an example embodiment.
Figure 20B:
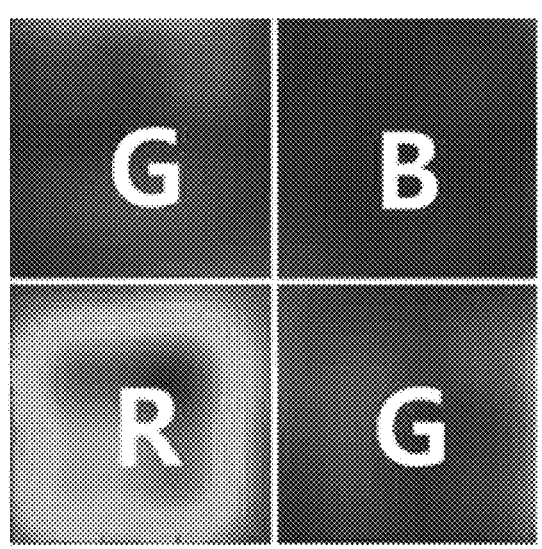
FIG. 20B shows that the red light is focused according to the phase distribution.

FIG. 20A shows a phase distribution for a region corresponding to the red light R in an image sensor according to an example embodiment, and FIG. 20B shows that the red light R is focused according to the phase distribution.

Figure 21:
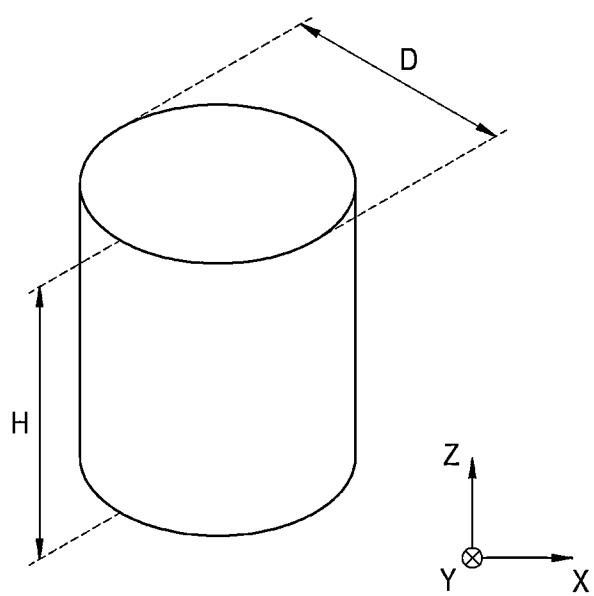
FIG. 21 is a diagram showing an example of a cylindrical nano-post employed in a color separation element of an image sensor according to an example embodiment.

FIG. 21 is a perspective view of an example form of a nano-post that may be employed in the color separation lens array 340 of an image sensor according to an embodiment. Referring to FIG. 21, the nano-post may have a cylindrical shape having a diameter D and a height H. At least one of the diameter D and the height H may be a sub-wavelength. The diameter D may vary according to a position at which the nano-post is placed.

The nano-post may be formed as a column having various other cross-sectional shapes. FIGS. 22A to 22H are plan views of example forms of a nano-post that may be employed in the color separation lens array 340 of an image sensor according to an example embodiment.

Figure 22A:
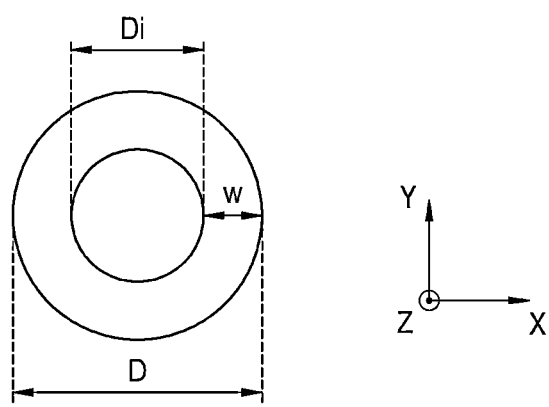
FIGS. 22A to 22H are diagrams showing examples of nano-posts employed in a color separation element of an image sensor according to an example embodiment.

As shown in FIG. 22A, the cross-sectional shape of the nano-post may be a circular ring-like shape having an outer diameter D and an inner diameter Di. A width w of the ring may be a sub-wavelength.

Figure 22B:
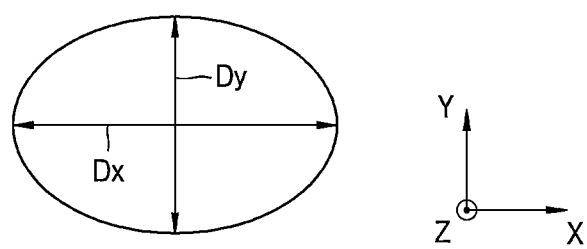

As shown in FIG. 22B, the cross-sectional shape of a nano-post may be an elliptical shape in which a length Dx of the major axis in a first direction (X direction) and a length Dy of the minor axis in a second direction (Y direction) are different from each other. Such a shape may be employed, for example, in the first region 151 and the fourth region 154 corresponding to green pixels, as shown in FIG. 7.

Figure 22C:
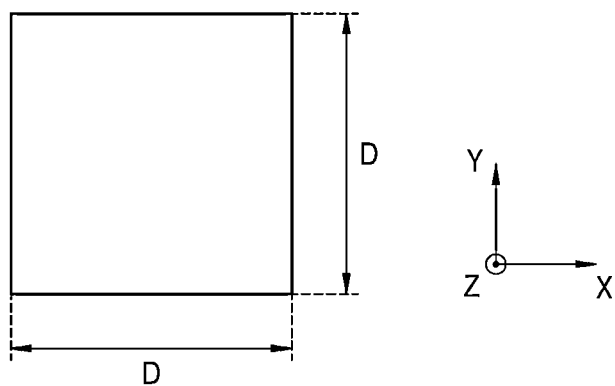
Figure 22D:
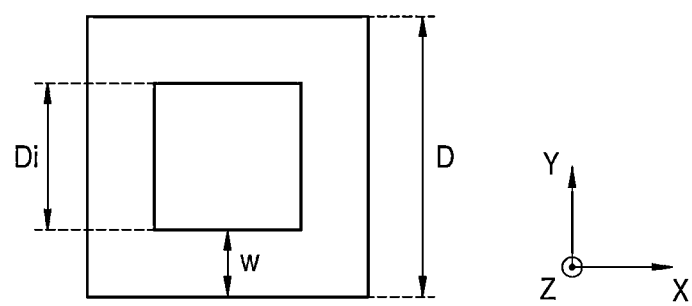
Figure 22E:
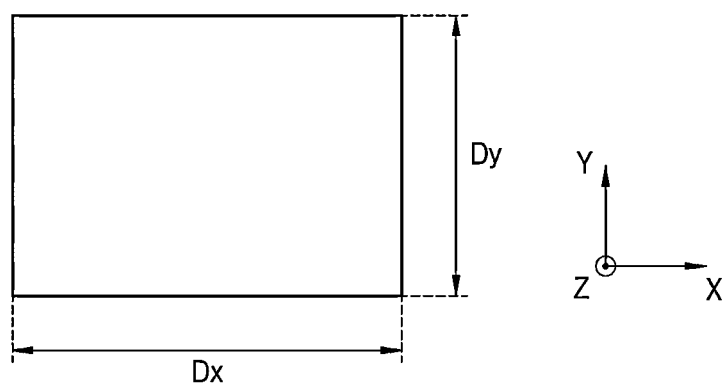
Figure 22F:
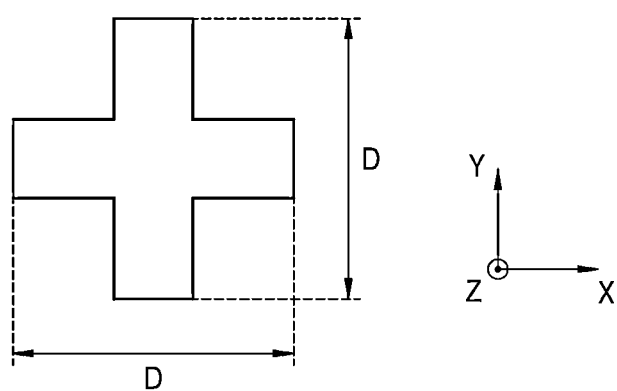

As shown in FIGS. 22C, 22D, and 22F, the cross-sectional shape of a nano-post may be a square shape, a square ring-like shape, or a cross-like shape.

Figure 22G:
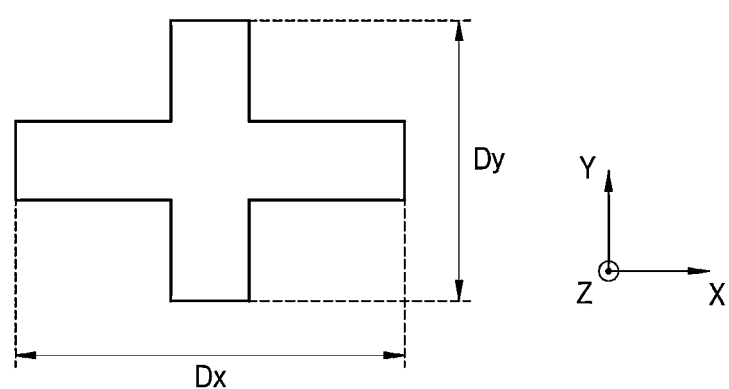

As shown in FIGS. 22E and 22G, the cross-sectional shape of a nano-post may be a rectangular shape or a cross-like shape in which a length Dx in the first direction (X direction) and a length Dy in the second direction (Y direction) are different from each other. Such a shape may be employed, for example, in the first region 151 and the fourth region 154 corresponding to green pixels.

Figure 22H:
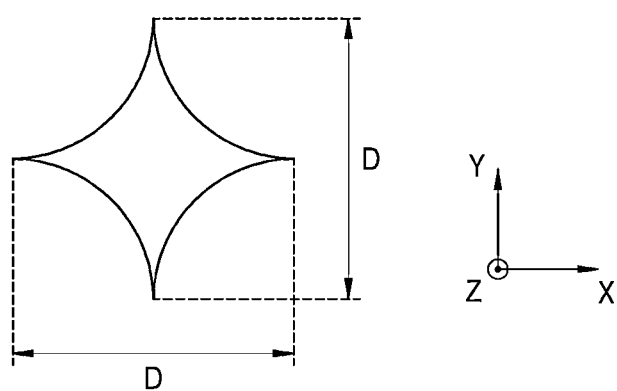

Also, as shown in FIG. 22H, the cross-sectional shape of a nano-post may be a shape having a plurality of concave arcs.

Figure 23:
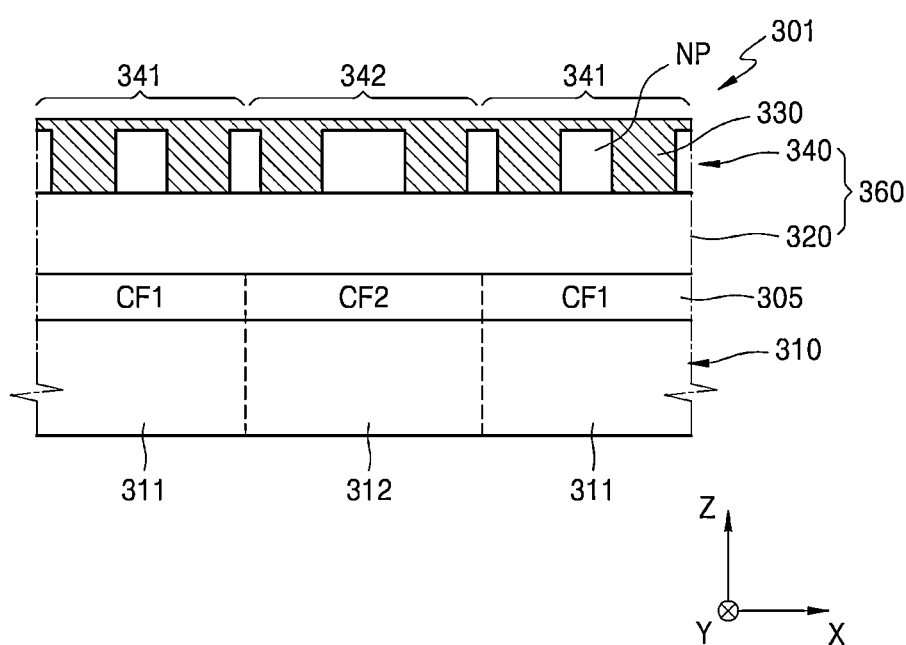
FIGS. 23 and 24 are diagrams showing an example in which a color filter is further provided in the image sensor shown in FIGS. 4 and 5.
Figure 24:
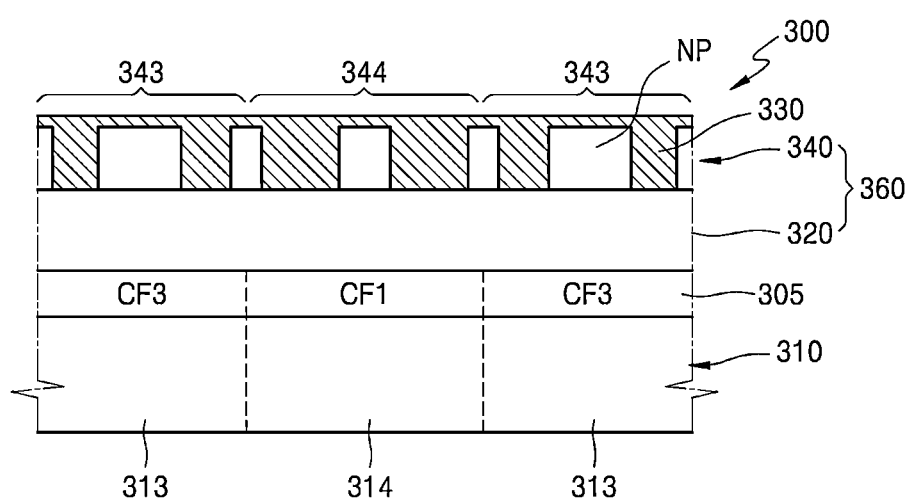

FIGS. 23 and 24 are schematic views of the structure of an image sensor according to another example embodiment. FIG. 23 is a cross-sectional view obtained along a line I-I of FIG. 3A, and FIG. 24 is a cross-sectional view obtained along a line II-II of FIG. 3A.

An image sensor 301 according to the example embodiment is an example of the image sensor 300 shown in FIGS. 4 and 5 further including a color filter 305. The color filter 305 may be further provided between the optical sensor 310 and the color separation element 360.

The color filter 305 may include a filter having a shape corresponding to the pixel arrangement of the Bayer pattern. For example, the color filter 305 may include a first color filter CF1, a second color filter CF2, and a third color filter CF3.

Since the color separation element 360 splits and focuses light of different wavelengths to the plurality of light detecting cells 311, 312, 313, and 314, the color filter 305 is not a necessary component. However, by additionally providing the color filter 305, the color purity may be further improved, and, in this case, an amount of incident light for each color may be reduced.

A dielectric layer 330 may be further provided on the color separation lens array 340. The dielectric layer 330 may be provided to completely cover a space between nano-posts NP adjacent to one another and the top surfaces of the nano-posts NP. The dielectric layer 330 may include a material having a refractive index lower than that of the nano-post NP. For example, the dielectric layer 330 may include the same material as the spacer layer 320.

The image sensor according to the above-described example embodiments may be employed in various image sensors, such as cameras or electronic devices. Such an electronic device may be, for example, a smart phone, a mobile phone, a mobile phone, a personal digital assistant (PDA), a laptop computer, a PC, various portable devices, and other mobile or non-mobile computing devices, but is not limited thereto.

Figure 25:
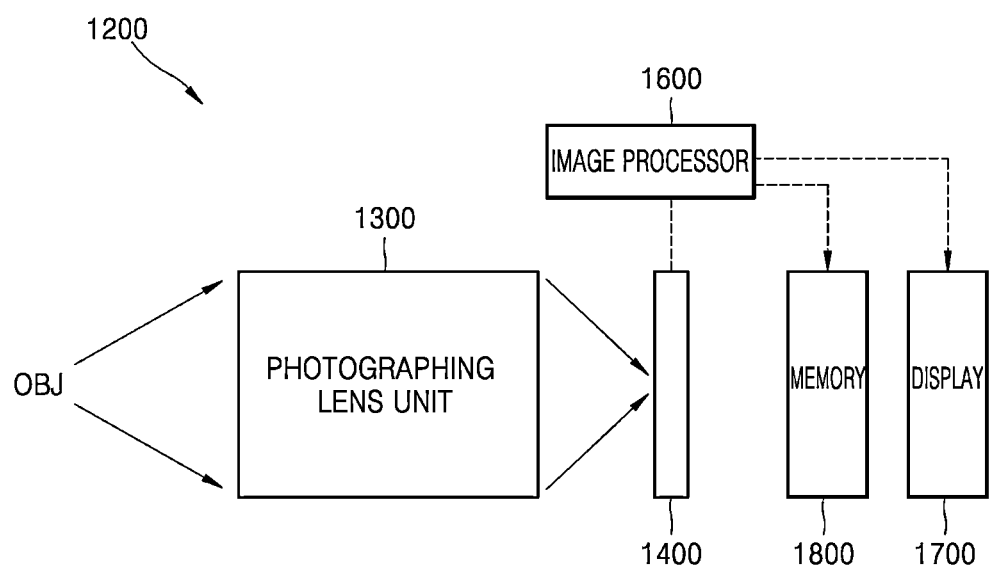
FIG. 25 is a schematic view of an image sensor according to an example embodiment.

FIG. 25 is a block diagram showing a schematic configuration of an image sensor according to an example embodiment.

The image sensor 1200 may include a photographing lens unit 1300 for focusing light reflected by an object OBJ and forms an optical image and an image sensor 1400 for converting the optical image formed by the photographing lens unit 1300 into electric signals. An infrared ray screening filter may be further provided between the image sensor 1400 and the photographing lens unit 1300.

As the image sensor 1400, the image sensor described above with reference to FIGS. 1 to 24 may be employed. The image sensor 1200 also includes an image processor 1600 that processes electrical signals from the image sensor 1400 into image signals. The image processor 1600 forms an image by performing operations, such as noise removal and color interpolation, on signals for each color sensed by the image sensor 1400. Also, the image sensor 1200 may further include a display 1700 for displaying an image formed by the image processor 1600 and a memory 1800 for storing image data formed by the image processor 1600.

Figure 26:
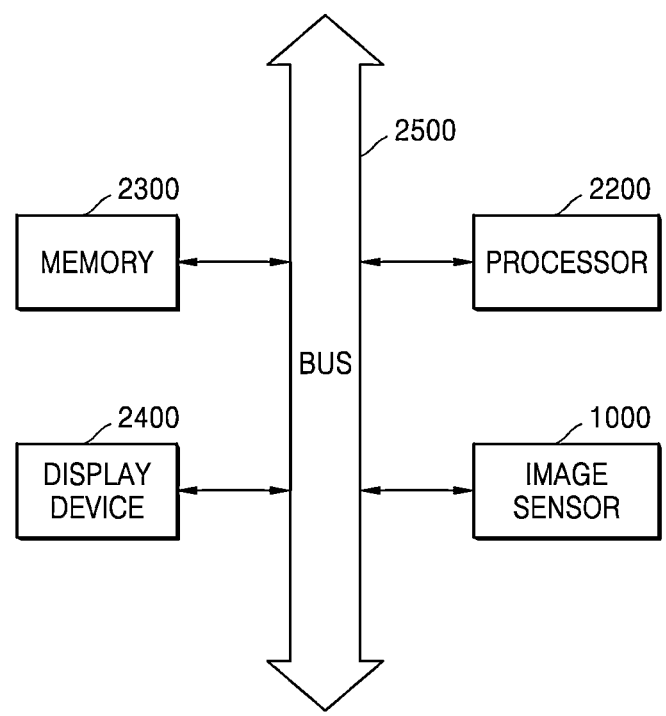
FIG. 26 is a schematic block diagram of an electronic device including an image sensor according to example embodiments.

FIG. 26 is a schematic block diagram of an electronic device including an image sensor according to example embodiments. The electronic device includes an image sensor 1000, a processor 2200, a memory 2300, a display 2400, and a bus 2500. The image sensor 1000 obtains image information regarding an outside target object under the control of the processor 2200 and provides the image information to the processor 2200. The processor 2200 may store image information provided from the image sensor 1000 in the memory 2300 through the bus 2500. The processor 2200 may also output image information stored in the memory 2300 to the display 2400 and display the image information to a user. Also, as described above, the processor 2200 may perform various image processing on image information provided from the image sensor 1000.

FIGS. 27 to 37 are diagrams showing examples of various multimedia devices, which are electronic devices to which image sensors according to example embodiments are applied.

Figure 27:
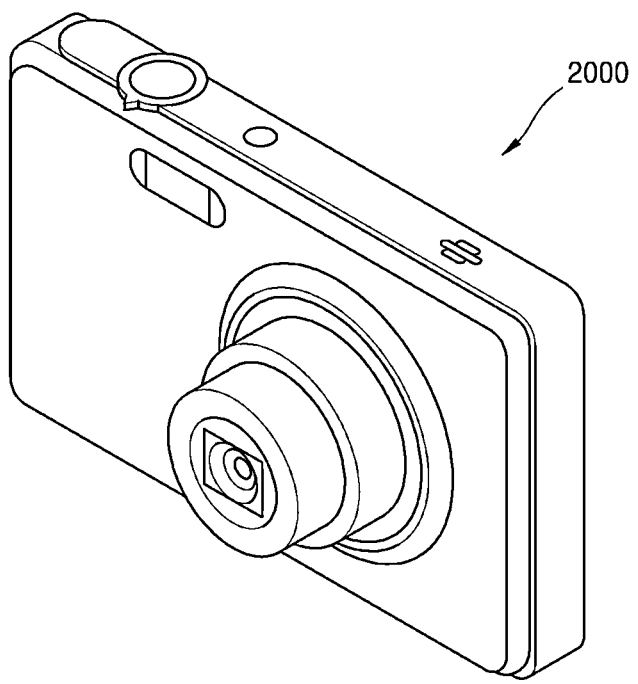
FIGS. 27 to 37 are diagrams showing examples of electronic devices to which image sensors according to embodiments are applied.

Image sensors according to example embodiments may be applied to various multimedia devices having an image capturing function. For example, the image sensor may be applied to a camera 2000 as shown in FIG. 27. The camera 2000 may be a digital camera or a digital camcorder.

Figure 28:
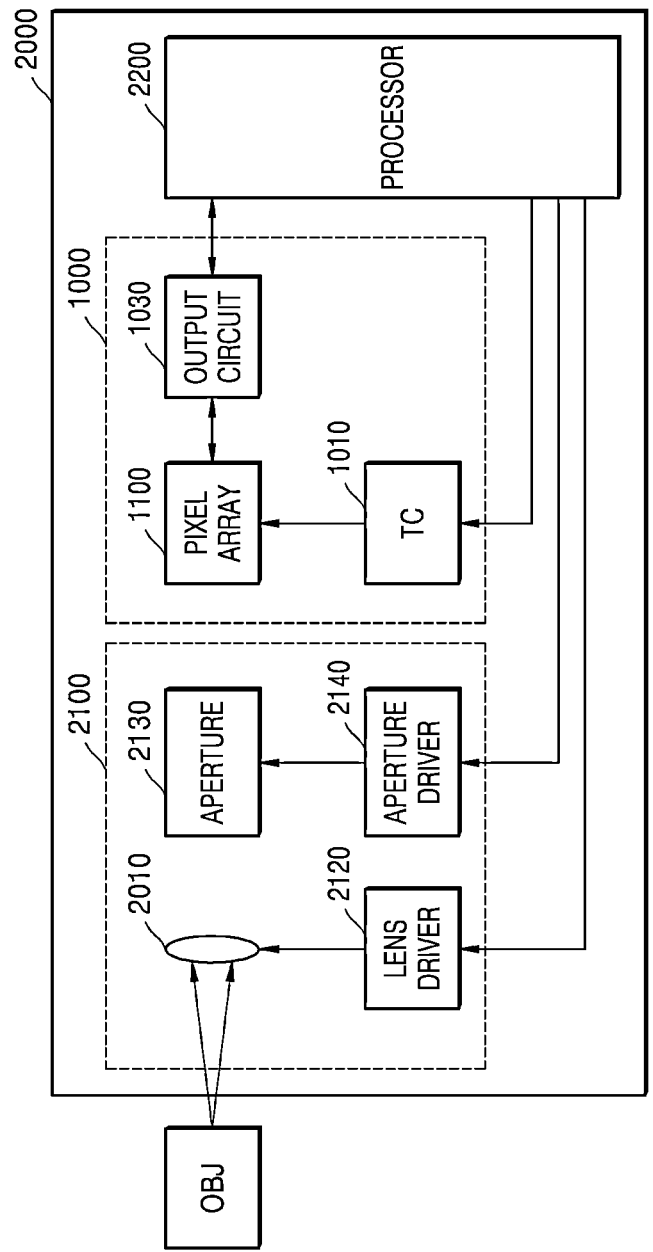

Referring to FIG. 28, the camera 2000 may include an image capturing unit 2100, the image sensor 1000, and the processor 2200.

The image capturing unit 2100 forms an optical image by focusing light reflected from a target object OBJ. The image capturing unit 2100 may include an object lens 2010, a lens driver 2120, an aperture 2130, and an aperture driver 2140. Although only one lens element is representatively shown in FIG. 28 for convenience of illustration, the object lens 2010 may actually include a plurality of lens elements having different sizes and shapes. The lens driver 2120 may communicate with the processor 2200 for information regarding focus detection and may adjust the position of the object lens 2010 according to a control signal provided from the processor 2200. The lens driver 2120 may move the object lens 2010 to adjust a distance between the object lens 2010 and the target object OBJ or adjust the positions of individual lens elements (not shown) in the object lens 2010. The focus on the target object OBJ may be adjusted as the lens driver 2120 drives the object lens 2010. The camera 2000 may have an auto focus function.

Also, the lens driver 2120 may communicate with the processor 2200 for information regarding an amount of light and may adjust the aperture 2130 according to a control signal provided from the processor 2200. For example, the aperture driver 2140 may increase or decrease the opening of the aperture 2130 and adjust the opening time of the aperture 2130 according to an amount of light entering the camera 2000 through the object lens 2010.

The image sensor 1000 may generate an electrical image signal based on the intensity of incident light. The image sensor 1000 may include the pixel array 1100, the timing controller 1010, and the output circuit 1030. Although not shown in FIG. 28, the image sensor 1000 may further include the row decoder shown in FIG. 1. Light transmitted through the object lens 2010 and aperture 2130 may form an image of the target object OBJ on a light-receiving surface of the pixel array 1100. The pixel array 1100 may be a CCD or CMOS that converts optical signals into electrical signals. The pixel array 1100 may include additional pixels for performing an AF function or a distance measuring function. Also, the pixel array 1100 may include a color separation lens array as described above.

The processor 2200 may control the overall operation of the camera 2000 and may have an image processing function. For example, the processor 2200 may provide control signals to the lens driver 2120, the aperture driver 2140, and the timing controller 1010 for the operations of the respective components.

Figure 29:
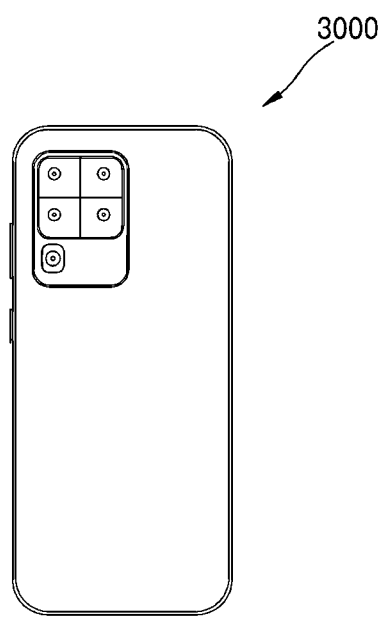
Figure 30:
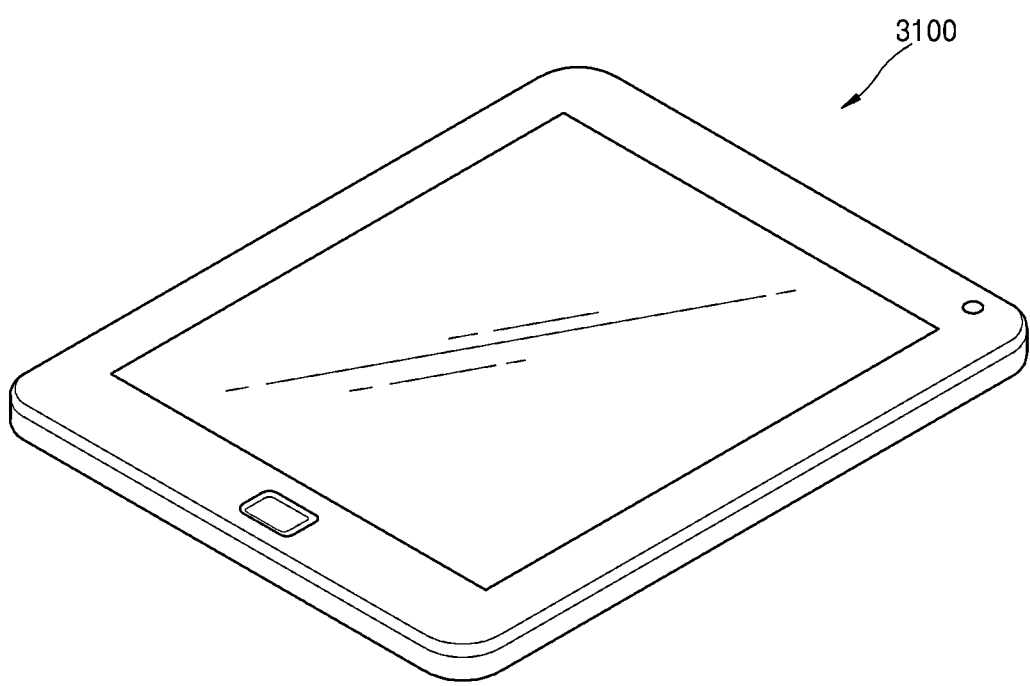
Figure 31:
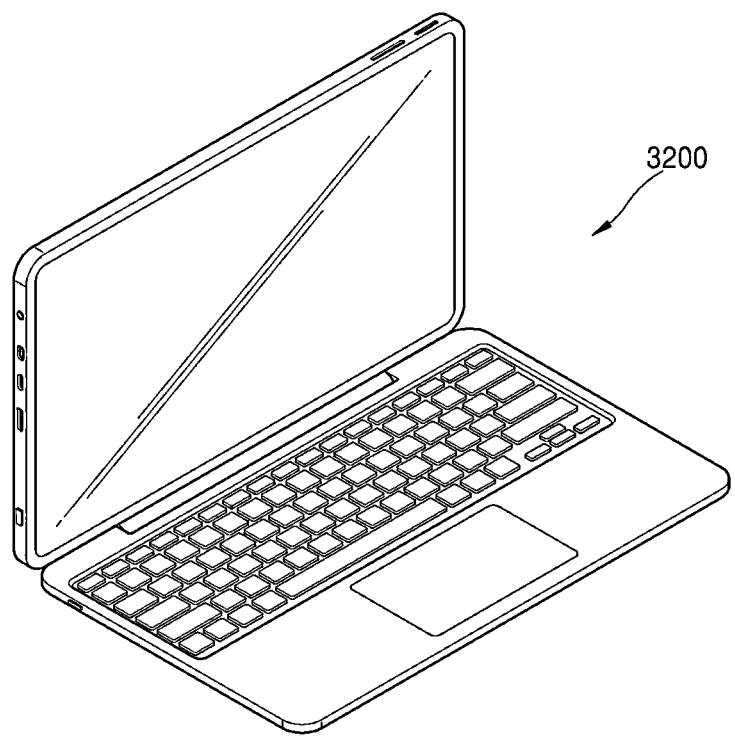
Figure 32:
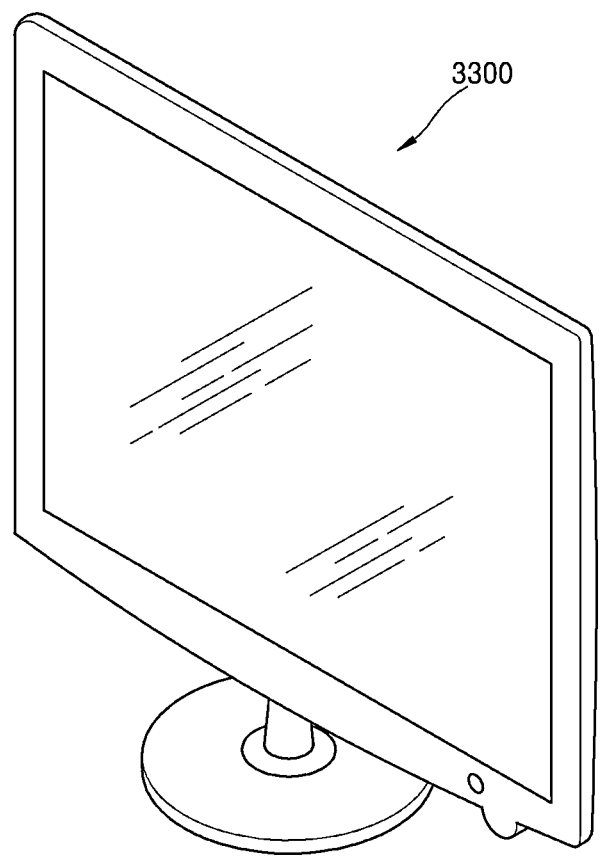

Also, an image sensor according to example embodiments may be applied to a mobile phone or smart phone 3000 as shown in FIG. 29 and may be applied to a tablet PC or smart tablet 3100 as shown in FIG. 30. Also, an image sensor according to example embodiments may be applied to a laptop computer 3200 as shown in FIG. 31 and may be applied to a TV or a smart TV 3300 as shown in FIG. 32.

For example, the smart phone 3000 or the smart tablet 3100 may include a plurality of high resolution cameras each equipped with a high resolution image sensor. By using high-resolution cameras, depth information regarding target objects in an image may be extracted, selective focusing of an image may be adjusted, or target objects in an image may be automatically identified.

Figure 33:
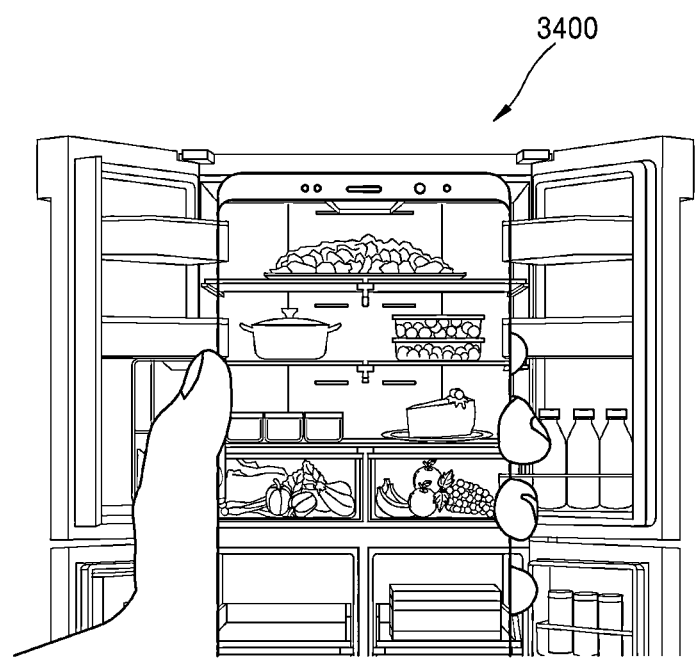
Figure 34:
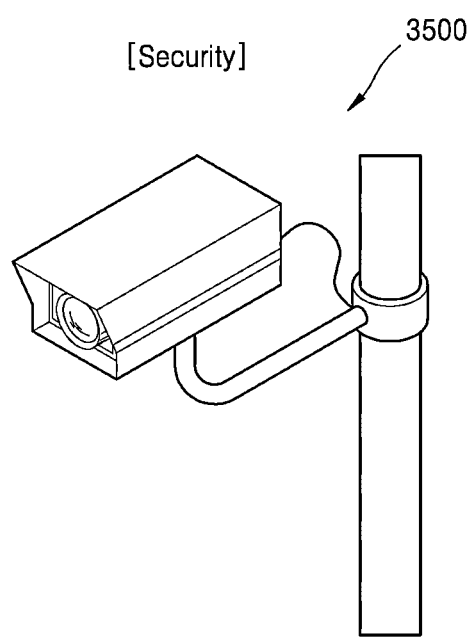
Figure 35:
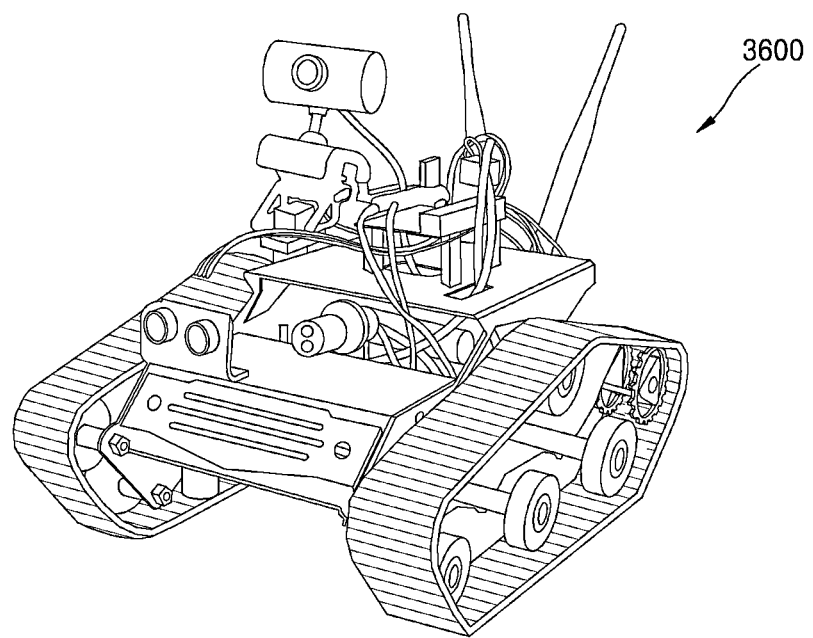
Figure 36:
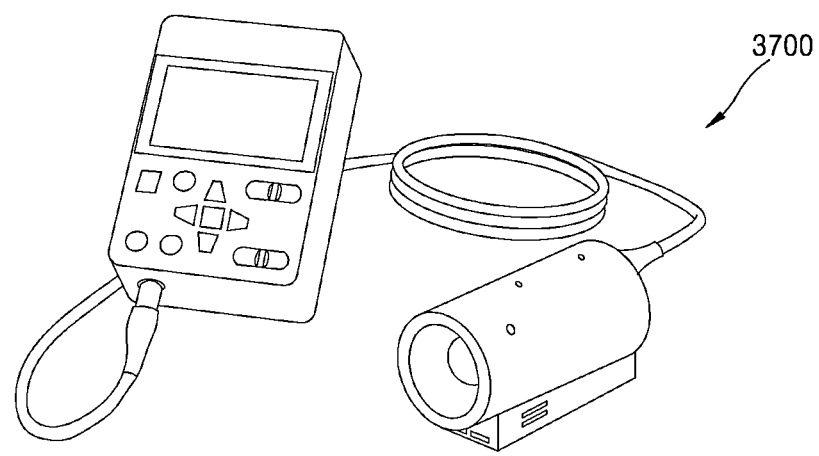

Also, an image sensor according to example embodiments may be applied to a smart refrigerator 3400 shown in FIG. 33, a security camera 3500 shown in FIG. 34, a robot 3600 shown in FIG. 35, and a medical camera 3700 shown in FIG. 36. For example, the smart refrigerator 3400 may automatically recognize food therein by using an image sensor and inform a user of information like the existence of a particular food, a type of food stocked or released through a smart phone. The security camera 3500 may provide an ultra-high resolution image and may use a high sensitivity to recognize an object or a person in an image even in a dark environment. The robot 3600 may be deployed to a disaster site or an industrial site that a person is unable to directly access and provide a high-resolution image. The medical camera 3700 may provide high-resolution images for a diagnosis or a surgery and may dynamically adjust the field of view.

Figure 37:
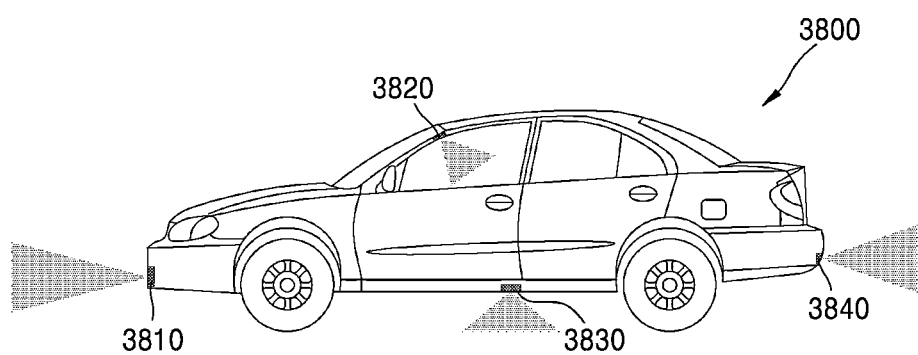

Also, the image sensor may be applied to a vehicle 3800 as shown in FIG. 37. The vehicle 3800 may include a plurality of vehicle cameras 3810, 3820, 3830, and 3840 arranged at various positions. The vehicle camera 3810, 3820, 3830, and 3840 may each include an image sensor according to an example embodiment. The vehicle 3800 may provide various information regarding the inside or around the vehicle 3800 to a driver by using the plurality of vehicle cameras 3810, 3820, 3830, and 3840 and may automatically recognize objects or people in an image and provide information needed for autonomous driving.

In a color separation element according to an example embodiment, a color separation lens array allows phases to be distributed within a periodic region and to be interrupted at the boundary of the periodic region, thereby reducing mixture of colors from neighboring regions. As a result, color purity may be improved.

An image sensor according to an example embodiment may improve image quality by improving color purity.

It should be understood that example embodiments described herein should be considered in a descriptive sense only and not for purposes of limitation. Descriptions of features or aspects within each embodiment should typically be considered as available for other similar features or aspects in other embodiments. While one or more example embodiments have been described with reference to the figures, it will be understood by those of ordinary skill in the art that various changes in form and details may be made therein without departing from the spirit and scope as defined by the following claims.

What is claimed is:

1. A color separation element comprising:
a spacer layer; and
a color separation lens array, which comprises one or more nano-posts arranged on the spacer layer, the color separation lens array configured to form a phase distribution that splits and focuses light incident to the color separation lens array based on wavelengths of the light,
wherein the color separation lens array comprises a plurality of periodic regions in which the one or more nano-posts are repeatedly arranged, and,
wherein the plurality of periodic regions comprises a first periodic region and a second periodic region adjacent to each other, and a first phase distribution formed by a first set of the one or more nano-posts of the color separation lens array in the first periodic region and a second phase distribution formed by a second set of the one or more nano-posts of the color separation lens array in the second periodic region do not overlap at a boundary between the first periodic region and the second periodic region.

2. The color separation element of claim 1, wherein the color separation lens array in one periodic region is configured to form an asymmetrical phase distribution for each wavelength light of the incident light.

3. The color separation element of claim 1, wherein the color separation lens array in one periodic region is configured to form a non-radial phase distribution for each wavelength light of the incident light.

4. The color separation element of claim 1, wherein the plurality of periodic regions comprises a first region for focusing first wavelength light, a second region for focusing second wavelength light, a third region for focusing third wavelength light, and a fourth region for focusing first wavelength light, the first region and the fourth region are located on a diagonal line, and the second region and a third region are located on a diagonal line.

5. The color separation element of claim 4, wherein the first wavelength light comprises green light, the second wavelength light comprises blue light, and the third wavelength light comprises red light.

6. The color separation element of claim 4, wherein the first wavelength light has a phase of $2N\pi$ at a center of the first region and the phase of the first wavelength light decrease in directions toward the outside of the first periodic region, where N is an integer greater than 0.

7. The color separation element of claim 6, wherein a phase of $(2N-1)\pi$ is exhibited at a center of the second region, and a phase of $(2N-1)\pi$ is exhibited at a center of the third region, where N is an integer greater than 0.

8. The color separation element of claim 1, wherein the color separation lens array is configured to form a continuous phase distribution within each of the plurality of periodic regions.

9. An image sensor comprising:
an optical sensor comprising a plurality of light detecting cells for sensing light;
a spacer layer provided in the optical sensor; and
a color separation lens array, which comprises one or more nano-posts arranged on the spacer layer, the color separation lens array configured to form a phase distribution that splits and focuses light incident to the color separation lens array based on wavelengths of the light,
wherein the color separation lens array comprises a plurality of periodic regions in which the one or more nano-posts are repeatedly arranged, and
wherein the plurality of periodic regions comprises a first periodic region and a second periodic region adjacent to each other, and a first phase distribution formed by a first set of the one or more nano-posts of the color separation lens array in the first periodic region and a second phase distribution formed by a second set of the one or more nano-posts of the color separation lens array in the second periodic region do not overlap at a boundary between the first periodic region and the second periodic region.

10. The image sensor of claim 9, wherein the color separation lens array in one periodic region is configured to form an asymmetrical phase distribution for each wavelength light of the incident light.

11. The image sensor of claim 9, wherein the color separation lens array in one periodic region is configured to form a non-radial phase distribution for each wavelength light of the incident light.

12. The image sensor of claim 9, wherein the plurality of periodic regions comprises a first region for focusing first wavelength light, a second region for focusing second wavelength light, a third region for focusing third wavelength light, and a fourth region for focusing first wavelength light, the first region and the fourth region are located on a diagonal line, and the second region and a third region are located on a diagonal line.

13. The image sensor of claim 12, wherein the first wavelength light comprises green light, the second wavelength light comprises blue light, and the third wavelength light comprises red light.

14. The image sensor of claim 12, wherein the first wavelength light has a phase of $2 n\pi$ at a center of the first region and the phase of the first wavelength light decrease in directions toward the outside of the first periodic region, where N is an integer greater than 0.

15. The image sensor of claim 14, wherein a phase of $(2N-1)\pi$ is exhibited at a center of the second region, and a phase of $(2N-1)\pi$ is exhibited at a center of the third region, where N is an integer greater than 0.

16. The image sensor of claim 9, wherein the color separation lens array is configured to form a continuous phase distribution within each of the plurality of periodic regions.

17. The image sensor of claim 9, further comprising a color filter between the optical sensor and the spacer layer.

18. The image sensor of claim 9, further comprising a photographing lens unit configured to focus light reflected by an object on a light incidence side of the color separation lens array and form an optical image.

* * * * *